US011829020B2

(12) United States Patent
Rhodes et al.

(10) Patent No.: US 11,829,020 B2
(45) Date of Patent: Nov. 28, 2023

(54) CONTROL TECHNIQUES FOR MULTIPLE ALTERNATING-INPUT DEVICES

(71) Applicant: Adobe Inc., San Jose, CA (US)

(72) Inventors: Tenell Rhodes, San Jose, CA (US); Gavin Stuart Peter Miller, Los Altos, CA (US); Christine Dierk, San Jose, CA (US)

(73) Assignee: ADOBE INC., San Jose, CA (US)

( * ) Notice: Subject to any disclaimer, the term of this patent is extended or adjusted under 35 U.S.C. 154(b) by 0 days.

(21) Appl. No.: 17/524,156

(22) Filed: Nov. 11, 2021

(65) Prior Publication Data

US 2023/0147823 A1  May 11, 2023

(51) Int. Cl.
*G02F 1/1334* (2006.01)
*G02F 1/1333* (2006.01)
*G02F 1/137* (2006.01)
*H03K 17/00* (2006.01)

(52) U.S. Cl.
CPC ........ *G02F 1/1334* (2013.01); *G02F 1/13775* (2021.01); *G02F 1/133305* (2013.01); *H03K 17/002* (2013.01)

(58) Field of Classification Search
CPC .. H03K 17/002; H03K 17/005; H03K 17/007; G02F 1/1334; G02F 1/13775; G02F 1/133305; H02J 1/084; H02J 3/005; H02J 3/007; H02J 3/14
See application file for complete search history.

(56) References Cited

U.S. PATENT DOCUMENTS 9,520,874 B2 * 12/2016 Bush ......................... H02J 9/06
10,935,861 B1   3/2021 Rhodes et al.
2021/0328496 A1 * 10/2021 Sera ....................... H02M 1/007

OTHER PUBLICATIONS

Smart Switchable Glass, Intelligent Glass, Privacy Glass, With Touch Screen System, Available on YouTube at: https://www.youtube.com/watch?v=Ggk8au7NOJg, Jan. 13, 2017, 3 pages.

* cited by examiner

*Primary Examiner* — Long Nguyen
(74) *Attorney, Agent, or Firm* — Kilpatrick Townsend & Stockton LLP

(57) ABSTRACT

A control system for independent alternating-input ("IAI") devices includes multiple IAI devices and an analog switch component. The control system may also include a bus-generating component. The analog switch component includes multiple switches configured to connect of disconnect input connection points of the analog switch component and voltage input points of the IAI devices. The analog switch component opens or closes switches, responsive to a digital control signal, to provide voltage signals to the voltage input points of the IAI devices. In some cases, the IAI devices activate or deactivate based on the provided voltage signals. In some cases, the bus-generating component provides a first voltage signal to a first voltage input point of an IAI device, and the analog switch component controls the switches to provide a second voltage signal to a second voltage input point of the IAI device.

20 Claims, 10 Drawing Sheets

CONTROL TECHNIQUES FOR MULTIPLE ALTERNATING-INPUT DEVICES

TECHNICAL FIELD

This disclosure relates generally to the field of control systems, and more specifically relates to control systems for devices used in flexible displays.

BACKGROUND

Development of flexible displays has progressed in recent years. Flexible displays can incorporate devices that are suitable for attachment to fabric, curved walls, or other surfaces that can be curved. In some cases, devices for flexible displays can be physically small, or require relatively low levels of voltage. In addition, devices for flexible displays can be independently controllable, such as devices that can be individually activated via a control signal or other input.

In some cases, contemporary control systems for flexible display devices may be inadequate for controlling larger quantities of devices. For example, contemporary control systems may require rigid circuit boards or other inflexible elements to mount multiple devices. The rigidity of such contemporary control systems can be unsuitable for clothing or other flexible items. In addition, contemporary control systems may be incapable of independently controlling a larger quantity of flexible display devices. For example, a contemporary control system can utilize individual switch components to manage a relatively small number of devices, such as one or two per switch. Such contemporary systems that utilize individual switch components may be expensive to manufacture or maintain. In addition, contemporary systems that utilize individual switch components may be excessively heavy or otherwise uncomfortable to wear, and thus could also be unsuitable for clothing or other flexible items.

SUMMARY

According to certain embodiments, a control system for independent alternating-input ("IAI") devices may include an IAI device and an analog switch component. The IAI device includes a first voltage input point and a second voltage input point. The analog switch component includes a first input connection point, a first switch, a second input connection point, and a second switch. The first switch is configured to selectively connect and disconnect the first input connection point and the first voltage input point. the second switch is configured to selectively connect and disconnect the second input connection point and the second voltage input point. The analog switch component is configured to, in a first state of the IAI device, provide a first voltage signal to the first voltage input point via the first switch. The analog switch component is further configured to, in the first state of the IAI device, provide a second voltage signal to the second voltage input point via the second switch. The analog switch component is further configured to, in a second state of the IAI device, provide the first voltage signal to the first voltage input point via the first switch and to the second voltage input point via a third switch of the analog switch component.

According to certain embodiments, a control system for IAI devices may include an IAI device, a bus-generating component, and an analog switch component. The IAI device includes a first voltage input point and a second voltage input point. The bus-generating component includes a first signal output point configured to provide a first voltage signal. The first signal output point and the first voltage input point have an electrical connection. The bus-generating component further includes a second signal output point configured to provide a second voltage signal. The analog switch component includes a first input connection point and a second input connection point. The second input connection point and the second signal output point of the bus-generating component are electrically connected. The analog switch component further includes a switch that is configured to selectively connect and disconnect the second input connection point and the second voltage input point of the IAI device. The bus-generating component is configured to provide the first voltage signal to the first voltage input point via the electrical connection. The analog switch component is configured to, responsive to a digital control signal indicating a first state, close the switch such that the second voltage signal is provided to the second voltage input point via the switch. The analog switch component is further configured to, responsive to the digital control signal indicating a second state, open the switch such that the second voltage input point is electrically disconnected from the switch.

According to certain embodiments, a control system for IAI devices may include a first IAI device, a second IAI device, and an analog switch component. The first IAI device has a first voltage input point and a second voltage input point. The second IAI device has a third voltage input point and a fourth voltage input point. The second voltage input point and the third voltage input point are electrically connected. The analog switch component includes a first input connection point, a second input connection point, a first switch, a second switch, and a third switch. The first switch is configured to selectively connect and disconnect the first input connection point to the second voltage input point and the third voltage input point. The second switch is configured to selectively connect and disconnect the second input connection point to the second voltage input point and the third voltage input point. The third switch is configured to selectively connect and disconnect the first input connection point to the fourth voltage input point. The first IAI device is configured to receive a first voltage signal via the first voltage input point. The analog switch component is configured to, responsive to a digital control signal indicating that the first IAI device has a first state, open the first switch and close the second switch such that a second voltage signal is provided to the second voltage input point and the third voltage input point via the second switch. The analog switch component is further configured to, responsive to the digital control signal indicating that the second IAI device has a same state as the first state of the first IAI device, close the third switch such that the first voltage signal is provided to the fourth voltage input point via the third switch.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

Features, embodiments, and advantages of the present disclosure are better understood when the following Detailed Description is read with reference to the accompanying drawings, where.

DETAILED DESCRIPTION

Figure 1:
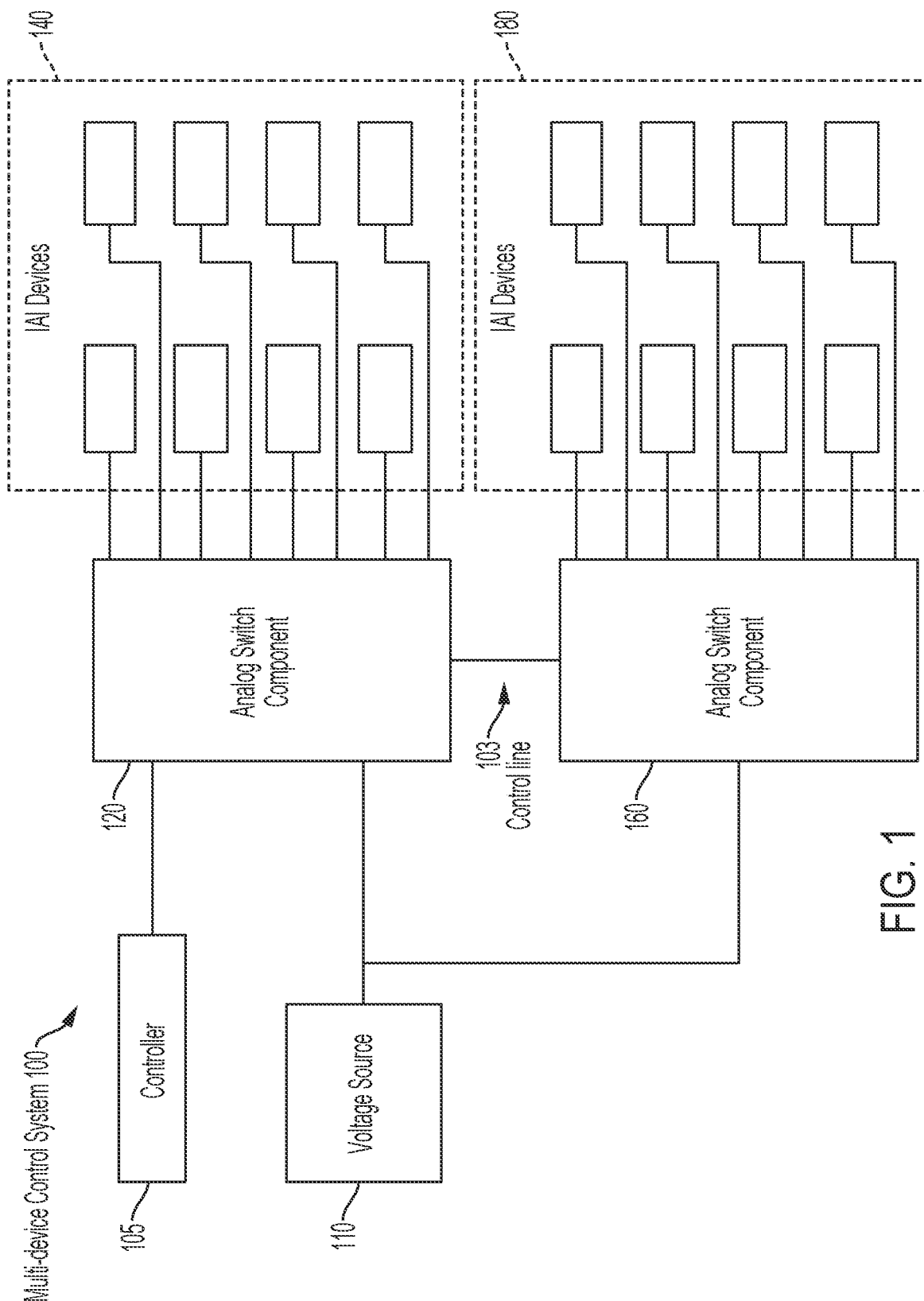
FIG. 1 is a diagram depicting an example of a multi-device control system in which multiple IAI devices can be controlled, according to certain embodiments.

As discussed above, prior techniques for controlling devices used in flexible displays include rigid or heavy materials, and are not physically suitable for use in wearable electronics or curved surfaces. In addition, prior techniques for controlling devices used in flexible displays are limited in how many devices can be independently controlled. Contemporary control systems that require individual switch components for each device are relatively expensive to manufacture, and can also be expensive or otherwise troublesome to maintain, requiring testing or replacement of a relatively large number of switch components per flexible display.

Certain embodiments described herein provide control systems for multiple devices that can be included in flexible displays. Multi-device control systems described herein can provide independent control of multiple devices via a particular switch component. Controlling multiple devices via a particular switch device can reduce weight and expense associated with flexible displays. In addition, multi-device control systems can increase the quantity of devices that may be attached to a flexible display, improving configurability of the flexible display. In some cases, increased configurability provided via a multi-device control system can improve a user experience for the flexible display, such as by expanding the quantity or type of devices used in creative expression. For example, if the flexible display is included in a wearable electronics item, such as a fashion item, a fashion designer or owner of the wearable item electronics could create relatively complex visual patterns (or other interactions) by utilizing a larger quantity of controllable devices.

The following examples are provided to introduce certain embodiments of the disclosed techniques. In this example, a multi-device control system includes at least one analog switch component and multiple independent alternating-input ("IAI") devices. The multi-device control system and the multiple IAI devices could be included in a flexible display, such as a wearable electronics clothing item that includes the multiple IAI devices. The multi-device control system can control the IAI devices to, for instance, provide a visual pattern, generate sound, or other controllable modifications of the example clothing item. The example analog switch component is configured to receive at least one voltage signal, such as a voltage signal of 5V, 7V, 15V, 30V, or another level that is suitable for IAI devices. In some cases, the one or more voltage signals include alternating voltage levels, such as a signal bus or an inverted signal bus.

Continuing with this example, the analog switch component includes multiple switches. Each of the switches is controllable responsive to a digital control signal received by the analog switch component. In addition, each of the IAI devices is electrically connected to one or more of the switches. For example each IAI device could have respective voltage input points that are electrically connected to one or more switches. In the example multi-device control system, the analog switch component individually controls each of the multiple IAI devices via the switches that are respectively connected to each IAI device. Responsive to the digital control signal, the analog switch component modifies the switches, e.g., opening or closing one or more switch. Based on a particular IAI device being electrically connected to opened or closed switches, one or more voltage signals are received by (or withheld from) the particular device. For example, if the example multi-device control system has a 4:1 configuration, the particular IAI device includes a first voltage input point that receives a signal bus. The particular IAI device also includes a second voltage input point that is electrically connected to at least two switches of the analog switch component. In the example 4:1 configuration, the analog switch component can modify the two switches such that the second voltage input point receives the signal bus or an inverted signal bus. In this example, the particular IAI device could be activated responsive to receiving the signal bus at the first voltage input point and the inverted signal bus, via one of the two switches, at the second voltage input point. In addition, the particular IAI device could be deactivated responsive to receiving the signal bus at the first voltage input point and also at the second voltage input point, via another of the two switches. The analog switch component can also independently control additional ones of the multiple IAI devices, via the switches electrically connected to the additional devices.

In some implementations described herein, an IAI device includes a device suitable for wearable electronics. Examples of IAI devices for wearable electronics include light-emitting diodes ("LEDs"), polymer dispersed liquid crystal ("PDLC") devices, polychromic material devices, speakers or other sound devices, motors (e.g., low-voltage motors), solenoids (e.g., electromagnets), or any other type of device suitable for including in a flexible display or other flexible arrangements. Additional information related to PDLC devices is described in U.S. Pat. No. 10,935,861 issued Mar. 2, 2021, entitled Modular Reflective Light-Diffused Devices, the entirety of which is incorporated herein by reference. An IAI device is configured to receive, for example, at least one voltage signal with alternating voltage levels, such as a square wave, a triangle wave, a sinusoidal wave, a non-periodic digital signal (e.g., rising or falling based on a control signal), or other types of voltage signals that alternate levels. In some cases, an IAI device is configured to receive a voltage signal that alternates at a particular frequency, such as at about 50 Hz. An IAI device can operate based on a voltage signal at positive and/or negative 1.5V, 3.3V, 5V, 7V, 15V, 30V, 60V, or another suitable level of relatively low voltage (e.g., within a range of about +60V to about −60V). In some cases, a particular range of relatively low voltages may be suitable for a particular type of flexible display. For example, a voltage range of about +60V to about −60V may be suitable for a flexible display on an architectural wall. In addition, a voltage range of about +15V to about −15V may be suitable for a flexible display on a wearable electronics item.

Implementations described herein are generally described in relation to wearable electronics, but example multi-device control systems as described herein can be utilized in other configurations. For example, an example multi-device control system could be used to control multiple IAI devices in an architectural space (e.g., on curved walls), on artistic installations, in a garden environment, or other implementations that include flexible, multi-planar (e.g., polyhedrons), or irregularly shaped surfaces.

Referring now to the drawings, FIG. 1 is a diagram depicting an example of a multi-device control system 100 in which multiple IAI devices can be controlled. The multi-device control system 100 includes at least one controller 105 and a voltage source 110. In addition, the multi-device control system 100 includes one or more analog switch components, such as an analog switch component 120 or an analog switch component 160, and one or more IAI devices, such as a group of IAI devices 140 or a group of IAI devices 180. Each of the device groups 140 and 180 includes multiple IAI devices, such as between 2 to 8 IAI devices. In the multi-device control system 100, the IAI devices 140 are connected to the analog switch component 120 and the IAI devices 180 are connected to the analog switch component 160. In some cases, the multi-device control system 100 includes one or more additional analog switch components connected to additional groups of IAI devices. For example, one or more additional analog switch components may be connected in a serial configuration (e.g., "daisy chain") to the analog switch component 160. In some cases, each additional analog switch component may be connected to a respective group of additional IAI devices. An example analog switch component could be a serially controlled octal SPST ("single-pull single-throw") switch component, such as a component ADG1414, but other types of analog switch components may be suitable.

In FIG. 1, the controller 105 is a microprocessor (or other suitable control component) that is configured to generate a control signal. The control signal may be a digital control signal, such as a digital control signal that utilizes synchronous communication protocol. An example protocol for a digital control signal includes a serial peripheral interface ("SPI") communication protocol, but other suitable protocols for digital control signals may be utilized. In the multi-device control system 100, one or more of the analog switch components 120 or 160 may receive a digital control signal from the controller 105. In some cases, a particular digital control signal is provided from a particular analog switch component to an additional analog switch component. For example, the digital control signal from the controller 105 is provided from the analog switch component 120 to the analog switch component 160 via a control line 103. In addition, the analog switch component 160 can be configured to provide the digital control signal to an additional analog switch component in the multi-device control system 100, such as via an additional control line. In some cases, a digital control signal is generated or repeated by one or more components in the multi-device control system 100, such as applying signal conditioning techniques to a received digital control signal that has fallen below a threshold voltage level. For example, an example multi-device control system could include one or more components configured to refresh a digital control signal, store the digital control signal in a buffer, or other suitable configurations for signal conditioning of a digital control signal. In some implementations, a digital control signal protocol that can be signal-conditioned by an analog switch component (or other component) may improve manufacturability or reduce costs of a multi-device control system, such as by reducing a number of controllers or signal-repeating components included in the example multi-device control system. FIG. 1 is described as having a particular digital control signal from the controller 105, but other implementations are possible. For example, a multi-device control system may include multiple controllers configured to provide respective digital control signals. In addition, a multi-device control system may include a particular controller that is configured to provide multiple digital control signals, or a digital control signal having multiple components (e.g., time division, frequency division) that are received and/or interpreted by respective analog switch components. In addition, a multi-device control system may receive a digital control signal from an additional component, such as via an antenna configured to communicate wirelessly with a controller located remotely from the multi-device control system.

In FIG. 1, the voltage source 110 is configured to provide one or more voltage signals to at least one analog switch component in the multi-device control system 100. For example, the voltage source 110 provides a first voltage signal, such as a positive voltage level, and a second voltage signal, such as a negative voltage level, to one or more of the analog switch components 120 and 160. The analog switch components 120 and 160 may receive the first and second voltage signals via a particular electrical connection (e.g., a single input) or via multiple connections (e.g., an input for the first voltage signal and an additional input for the second voltage signal). In some cases, the first and second voltage signals respectively have a constant (or substantially constant) level, such as about +15V and −15V. FIG. 1 describes the voltage source 110 as providing +/−15V, but other implementations are possible, such as voltage levels of +5V and −5V, +30 V and −30V, +15V and 0V, or other suitable levels for a voltage signal. In some cases, a multi-device control system may include a voltage source that provides an alternating voltage signal, such as a square wave, a triangle wave, a sinusoidal wave (e.g., AC waveform), or another alternating voltage signal that is suitable for IAI devices controllable by the example multi-device control system.

FIG. 1 depicts the analog switch components 120 and 160 as being configured to receive voltage signals from the voltage source 110, but other implementations are possible. For example, a multi-device control system can include a signal-generating analog switch component, such as a particular analog switch component that generates at least one voltage signal (e.g., a square wave signal) based on one or more voltage signals received from a voltage source. In some cases, one or more additional analog switch components can receive the at least one voltage signal from the signal-generating analog switch component, as described in regard to, at least, FIGS. 6-7.

In some implementations, each of the analog switch components 120 and 160 provides control voltage signals to multiple IAI devices. The control voltage signals to the IAI devices may be based on the one or more voltage signals received by the analog switch components 120 and 160. For example, the analog switch component 120 provides, to each IAI device in the group of devices 140, a respective set of control voltage signals. A particular IAI device in the group of devices 140 receives, for instance, a first voltage signal via a first voltage input point and a second voltage signal via a second voltage input point. In addition, each additional IAI device in the group of devices 140 receives from the analog switch component 120 a respective voltage signal and additional voltage signal via respective voltage input points. In addition, the analog switch component 160 provides, to each IAI device in the group of devices 180, a respective set of control voltage signals. A particular IAI device in the group of devices 180 receives, for instance, a first voltage signal via a first voltage input point and a second voltage signal via a second voltage input point. In addition, each additional IAI device in the group of devices 180 receives from the analog switch component 160 a respective voltage signal and additional voltage signal via respective voltage input points.

In some cases, each of the analog switch components 120 and 160 provides the respective voltage signals to each of the IAI devices 140 and 180 responsive to the digital control signal from the controller 105. For instance, the digital control signal includes data for each of the IAI devices 140 and 180, such as data indicating whether each particular IAI device is activated or deactivated. In some cases, the data in the digital control signal can indicate an address (or other identification data) for each of the IAI devices 140 and 180. In addition, the data in the digital control signal can indicate whether one or more switches in the analog switch components 120 and 160 are activated or deactivated (e.g., open or closed). For example, the digital control signal can include data indicating activation for a set of switches associated with a particular IAI device in the group of devices 140, such as a set of switches electrically connected to voltage input points of the particular device. Each switch in the set of switches can be configured to selectively connect and disconnect a voltage input point of the particular IAI device with a respective input connection point of the analog switch components 120 or 160. Responsive to the digital control signal, for example, the analog switch component 120 activates the set of switches for the particular IAI device, such that the particular device receives the input voltage signals via the voltage input points. In addition, the particular IAI device activates (or deactivates) responsive to receiving the control voltage signals. States of activation or deactivation may include powering on, powering off, adjusting an output level (e.g., adjust volume, modify color), entering a standby state, or other suitable types of operation for an IAI device.

FIG. 1 describes the IAI devices 140 and 180 as receiving the control voltage signals via switches in the analog switch components 120 and 160, but other implementations are possible. For example, a multi-device control system can include a multiplexer component, a component having one or more single-pull multi-throw relays, or other components suitable to provide a voltage control signal to an IAI device via an electrical connection.

Figure 2:
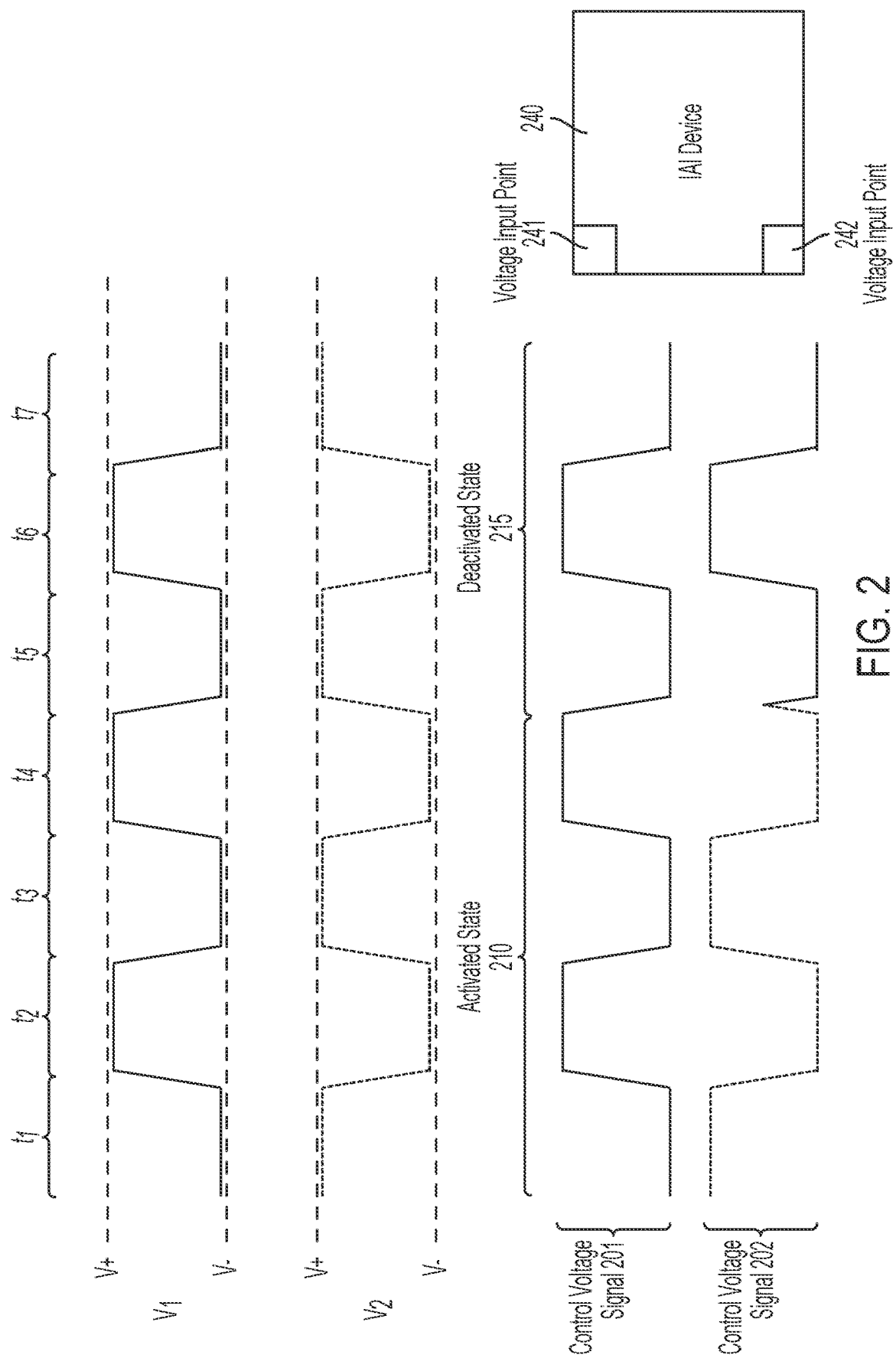
FIG. 2 is a diagram depicting example voltage signals provided by a multi-device control system, according to certain embodiments.

FIG. 2 is a diagram depicting example voltage signals that are provided by a multi-device control system, such as the multi-device control system 100. In some cases, the example voltage signals are used to provide control to one or more IAI devices, such as an IAI device 240. The IAI device 240 is electrically connected to an analog switch component, such as a particular one of the IAI devices 140 that is connected to the analog switch component 120.

In FIG. 2, a first voltage signal $V_1$ and a second voltage signal $V_2$ include respective voltage levels. The respective voltage levels may alternate between (or otherwise include) a relatively higher voltage V+ and a relatively lower voltage V− (e.g., about +15V to about −15V, or other suitable voltages). For example, first the voltage signal $V_1$ includes the lower voltage V− at time periods $t_1$, $t_3$, $t_5$, and $t_7$, and includes the higher voltage V+ at time periods $t_2$, $t_4$, and $t_6$. In addition, the second voltage signal $V_2$ includes the higher voltage V+ at the time periods $t_1$, $t_3$, $t_5$, and $t_7$, and includes the lower voltage V− at the time periods $t_2$, $t_4$, and $t_6$. In some cases, the voltage signals $V_1$ and $V_2$ alternate at a particular frequency, such as a frequency of about 50 Hz. In some implementations, a voltage signal of about 50 Hz may reduce or prevent degradation of some types of IAI devices, such as a PDLC device. For convenience, and not by way of limitation, FIG. 2 depicts waveforms associated with $V_1$ using a solid line and waveforms associated with $V_2$ using a dotted line.

In some implementations, the first voltage signal $V_1$ and the second voltage signal $V_2$ are generated by one or more components of the example multi-device control system, such as by an analog switch component. In some cases, the example analog switch component generates the voltage signals $V_1$ and $V_2$ by activating or deactivating (e.g., opening or closing) multiple switches that are included in the example analog switch component. For example, each of the analog switch components 120 and 160 generates the voltage signals $V_1$ and $V_2$ by opening and closing switches that are electrically connected to the voltage source 110. In some cases, the voltage signals $V_1$ and $V_2$ are generated by a signal-generating analog switch component. The example signal-generating analog switch component can be configured to provide the voltage signals $V_1$ and $V_2$ to one or more additional components in a multi-device control system, such as via a signal bus or an inverted signal bus.

In some implementations, the first voltage signal $V_1$ and second voltage signal $V_2$ are provided to the IAI device 240, such as via a first voltage input point 241 or a second voltage input point 242. The voltage input points 241 and 242 are electrically connected to, for example, a set of switches included in the analog switch component 120. In addition, the analog switch component 120 modifies switch states (e.g., activates or deactivates) of the set of switches to generate a temporal combination of the voltage signals $V_1$ and $V_2$. The combinations of the voltage signals $V_1$ and $V_2$ generate a first control voltage signal 201 and a second control voltage signal 202. For example, the analog switch component 120 modifies switch states such that the first control voltage signal 201 includes the voltage signal $V_1$ during time periods $t_1$ through $t_7$. In addition, the analog switch component 120 modifies switch states such that the second control voltage signal 202 includes the voltage signal $V_2$ during time periods $t_1$ through $t_4$ and includes the voltage signal $V_1$ during time periods $t_5$ through $t_7$. Other combinations of voltage signals may be generated via additional suitable modifications to switch states.

In FIG. 2, the first control voltage signal 201 is received by the IAI device 240 via the voltage input point 241. The second control voltage signal 202 is received by the IAI device 240 via the voltage input point 242. In some cases, the IAI device 240 enters an activated state 210 during time periods $t_1$ through $t_4$, responsive to the control voltage signals 201 and 202. For example, the IAI device 240 may enter the activated state 210 responsive to receiving a voltage differential across the voltage input points 241 and 242, such as a differential between the different voltage levels of signals $V_1$ and $V_2$ during the time periods $t_1$ through $t_4$. In addition, the IAI device 240 enters a deactivated state 215 during time periods $t_5$ through $t_7$, responsive to the control voltage signals 201 and 202. For example, the IAI device 240 may enter the deactivated state 215 responsive to a reduced or absent voltage differential (e.g., similar voltage levels) across the voltage input points 241 and 242, such as the similar voltage levels of signal $V_1$ during the time periods $t_5$ through $t_7$. In some cases, the IAI device 240 is controlled, e.g., activated or deactivated, via a presence or absence of a sufficient voltage differential across the voltage input points 241 and 242, such as differentials between the voltage levels included in the control voltage signals 201 and 202. In addition, the analog switch component 120 controls the IAI device 240 individually, such that the IAI device 240 can have different, identical, or partly related activity as compared to other IAI devices, e.g. in the group of devices 140. As used herein, a voltage differential that is "sufficient" is a voltage differential with a value that activates a IAI device receiving the voltage differential across multiple voltage input points. In some cases, particular types of IAI devices may activate responsive to a sufficient voltage differential with a particular value. In addition, particular types of IAI devices may activate with particular responses (e.g., faster/slower activation, color selection activation) based on a value of a sufficient voltage differential. For example, a PDLC device could activate responsive to a sufficient voltage differential of about 30 V. In addition, a speaker device could activate at a first frequency responsive to a sufficient voltage differential of about 20 mV and at a second frequency responsive to a sufficient voltage differential of about 5 mV. Other IAI devices (or types of IAI devices) with additional sufficient voltage differentials may be utilized.

In some cases, the example multi-device control system configures one or more switches such that the IAI device 240 does not receive a voltage signal. For example, the analog switch component 120 could open one or more switches such that at least one of the voltage input points 241 or 242 are electrically disconnected, e.g., are allowed to float. In some cases, one or more voltage input points of the IAI device 240 is allowed to float subsequent to the deactivated state 215. For instance, following deactivation (e.g., powering off) of the IAI device 240, switches in the analog switch component 120 may be opened such that one or more of the control voltage signals 201 or 202 is withheld from the voltage input points 241 or 242.

In some implementations, one or more of the voltage signals $V_1$ and $V_2$ or the control voltage signals 201 or 202 are modified via pulse width modulation ("PWM"). For instance, an example multi-device control system could include a PWM component configured to modify a voltage signal provided by a voltage source or an analog switch component. In addition, an analog switch component could modify switch states such that a control voltage signal has a particular voltage level for relatively shorter or longer amounts of time. In some cases, an IAI device modifies an output responsive to receiving a PWM-modified control voltage signal, such as activating a motor or light-emitting component for relatively shorter or longer periods of time.

1:1 Configuration

Figure 3:
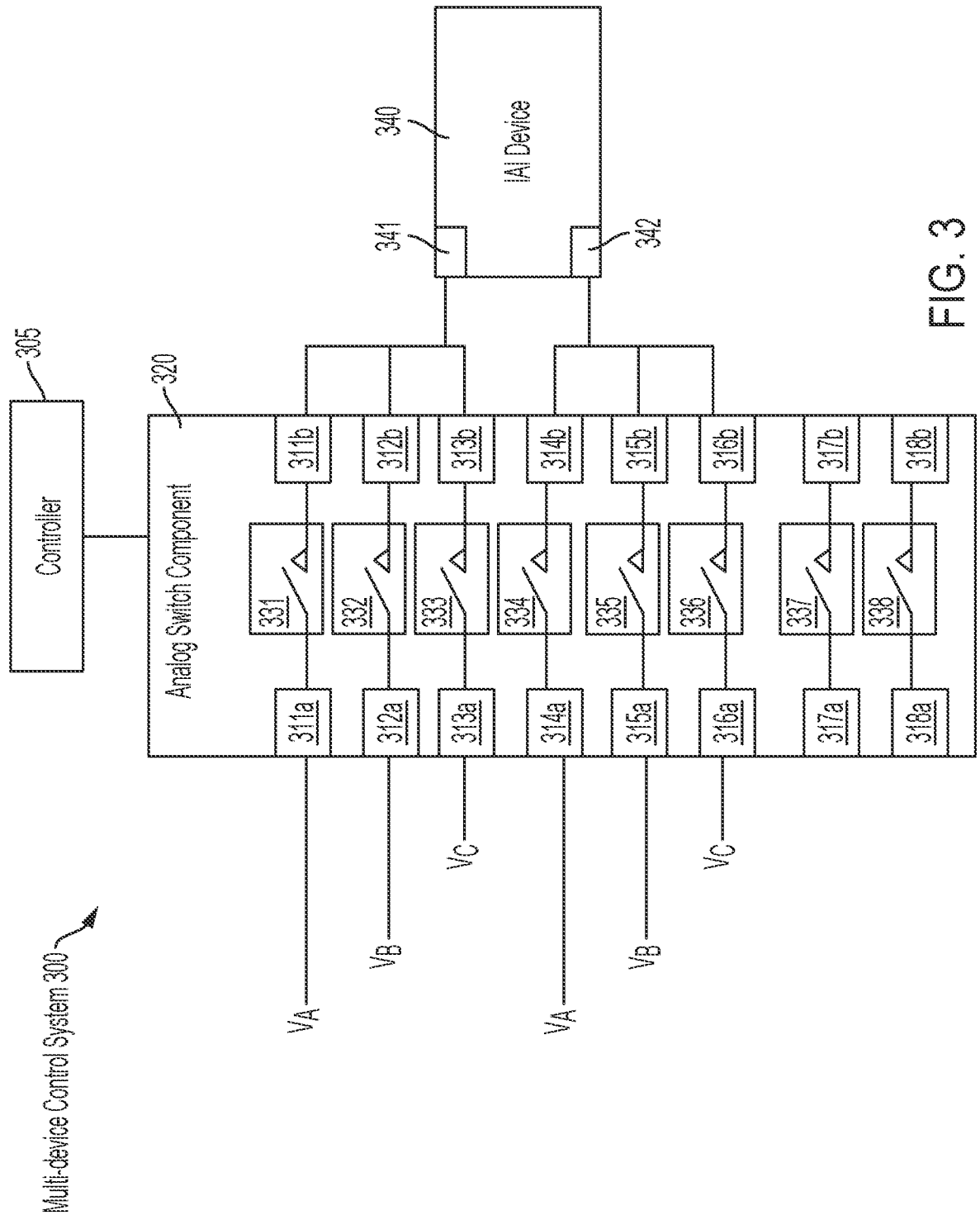
FIG. 3 is a diagram depicting an example of a multi-device control system configured to control multiple IAI devices utilizing a 1:1 configuration, according to certain embodiments.

FIG. 3 is a diagram depicting an example of a multi-device control system 300 in which an analog switch component 320 is configured to provide control voltage signals to a particular IAI device, such as an IAI device 340. The IAI device 340 includes a first voltage input point 341 and a second voltage input point 342. The multi-device control system 300 includes a controller 305. In some cases, for convenience and not by way of limitation, the multi-device control system 300 is referred to as a 1:1 configuration, such as a configuration in which a particular analog switch component provides control for a single IAI device. In some cases, one or more additional analog switch components are included in the multi-device control system 300, such as additional analog switch components connected (e.g., daisy-chained) to the analog switch component 320.

In FIG. 3, the analog switch component 320 is an octal switch component including eight switches, including switches 331, 332, 333, 334, 335, 336, 337, and 338. In the analog switch component 320, the switch 331 has an input connection point 311a and an output connection point 311b. In addition, the switch 332 has respective input and output connection points 312a and 312b, the switch 333 has respective input and output connection points 313a and 313b, the switch 334 has respective input and output connection points 314a and 314b, the switch 335 has respective input and output connection points 315a and 315b, the switch 336 has respective input and output connection points 316a and 316b, the switch 337 has respective input and output connection points 317a and 317b, and the switch 338 has respective input and output connection points 318a and 318b.

Each of the switches 331-338 can be configured to receive, via respective ones of the input connection points 311a-318a, one or more voltage signals. For instance, the input connection points 311a and 314a are configured to receive a first voltage signal $V_A$. In addition, the input connection points 312a and 315a are configured to receive a second voltage signal $V_B$. Further, the input connection points 313a and 316a are configured to receive a third voltage signal $V_C$. In FIG. 3, one or more of the voltage signals $V_A$, $V_B$, or $V_C$ may be received from a voltage source, such as the voltage source 110 described in regards to FIG. 1. For example, the voltage signal $V_A$ is a constant (or substantially constant) first voltage level, such as +15V or another suitable voltage level. In addition, the voltage signal $V_B$ is a constant (or substantially constant) second voltage level, such as 0V or another suitable voltage level. Further, the voltage signal $V_C$ is a constant (or substantially constant) third voltage level, such as −15V or another suitable voltage level. FIG. 3 describes the voltage signals $V_A$, $V_B$, and $V_C$ as being constant or substantially constant, but other implementations are possible. For example, a multi-device control system in a 1:1 configuration could receive voltage signals that alternate levels during multiple time periods, such as the voltage signals $V_1$ and $V_2$ described in regard to FIG. 2. In FIG. 3, one or more of the switches 337 or 338 (and the respective input and output connection points) could be electrically disconnected, or could be used to selectively connect or disconnect additional components, e.g., providing the voltage signals $V_A$, $V_B$, $V_C$, or an additional voltage signal.

In FIG. 3, the IAI device 340 is configured to receive at least one of the voltage signals $V_A$, $V_B$, or $V_C$ at each respective voltage input point, such as via the switches 331-338. For instance, the voltage input point 341 is electrically connected to the output connection points 311b, 312b, and 313b. The IAI device 340 is configured to receive, at the voltage input point 341, one or more of the voltage signals $V_A$, $V_B$, and $V_C$ via, respectively, the switches 331, 332, and 333. In addition, the voltage input point 342 is electrically connected to the output connection points 314b, 315b, and 316b. The IAI device 340 is configured to receive, at the voltage input point 342, one or more of the voltage signals $V_A$, $V_B$, and $V_C$ via, respectively, the switches 334, 335, and 336.

In the multi-device control system 300, the controller 305 provides to the analog switch component 320 a digital control signal, such as a signal using an SPI communication protocol. Responsive to the digital control signal from the controller 305, the analog switch component 320 modifies states of one or more of the switches 331-338, such as to provide one or more control voltage signals to the IAI device 340 via one or more of the switches 331-336. For example, responsive to the digital control signal indicating a first state (e.g., activated) for the IAI device 340, the analog switch component 320 closes the switches 331 and 336, such that the IAI device receives the voltage signal $V_A$ (e.g., +15V) via the voltage input point 341 and the voltage signal $V_C$ (e.g., −15V) via the voltage input point 342. In addition, responsive to the digital control signal indicating a second state (e.g., deactivated) for the IAI device 340, the analog switch component 320 closes the switches 332, and 335 such that the IAI device 340 receives the voltage signal $V_B$ (e.g., 0V) via the voltage input points 341 and 342. In some cases, the analog switch component 320 modifies one or more of the switches 331-336 during the first state, such as opening or closing the switches 331 and 333 (or the switches 334 and 336) in an alternating pattern at about 50 Hz. Based on the modified states of the switches 331 and 333, the analog switch component 320 provides the voltage signals $V_A$ or $V_C$, e.g., in an alternating pattern, to the voltage input point 341. In addition, based on the modified states of the switches 334 and 336, the analog switch component 320 provides the voltage signals $V_A$ or $V_C$, e.g., in an alternating pattern, to the voltage input point 342. In some cases, during the first state, the analog switch component 320 opens the switches 332 and 335. In some cases, during the second state, the analog switch component 320 opens the switches 331, 333, 334, and 336.

In some cases, the analog switch component 320 modifies states of the switches 331-336 such that the voltage input points 341 and 342 receive control voltage signals, such as described in regards to FIG. 2. For example, the IAI device 340 activates (e.g., powers on) responsive to receiving control voltage signals that generate a voltage differential across the points 341 and 342, such as receiving, at time periods in an alternating signal pattern, the voltage signal $V_A$ via the switches 331 and 334 and the voltage signal $V_C$ via the switches 333 and 336. In addition, the IAI device 340 deactivates (e.g., powers off) responsive to receiving similar control voltage signals (e.g., a voltage differential that is not sufficient for activation) via the points 341 and 342, such as receiving the voltage signal $V_B$ (e.g., 0V) via the switches 332 and 335. In some cases, the IAI device 340 deactivates responsive to one or more of the voltage input points 341 or 342 being allowed to float (e.g., electrically disconnected). In FIG. 3, the analog switch component 320 is described as providing voltage control signals via one or more of the switches 331-338, but other implementations are possible, such as a multi-device control system that provides one or more voltage control signals via a single-pull multi-throw relay, a multiplexer, or another suitable component. In some cases, the multi-device control system 300 could include a PWM component configured to modify one or more of the voltage signals $V_A$, $V_B$, or $V_C$. In addition, the example analog switch component could modify switch states such that one or more of the voltage signals $V_A$, $V_B$, or $V_C$ has a particular voltage level for relatively shorter or longer amounts of time.

2:1 Configuration

Figure 4:
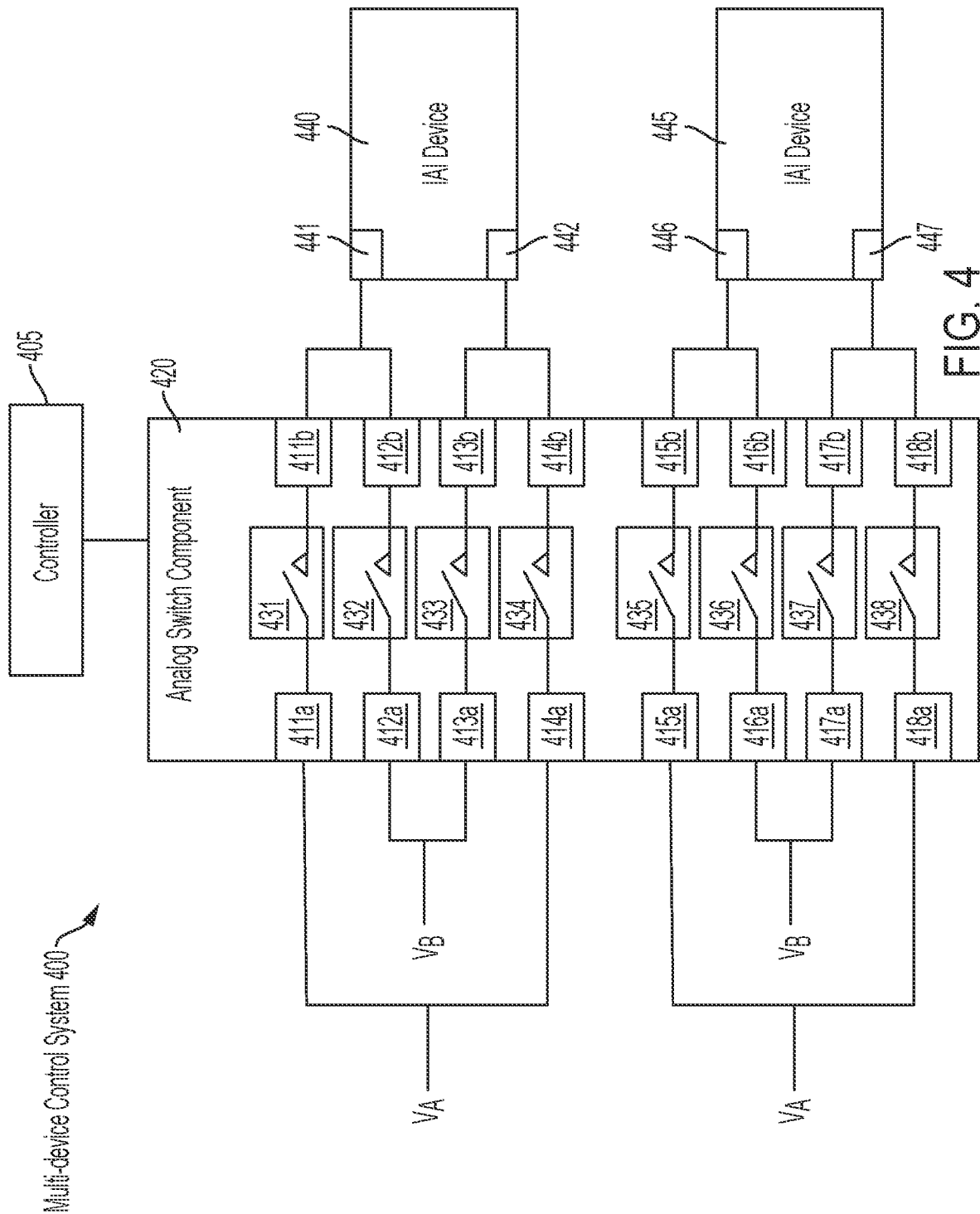
FIG. 4 is a diagram depicting an example of a multi-device control system configured to control multiple IAI devices utilizing a 2:1 configuration, according to certain embodiments.

FIG. 4 is a diagram depicting an example of a multi-device control system 400 in which an analog switch component 420 is configured to provide control voltage signals to multiple IAI devices, including an IAI device 440 and an IAI device 445. The IAI device 440 includes a first voltage input point 441 and a second voltage input point 442. The IAI device 445 includes a first voltage input point 446 and a second voltage input point 447. The multi-device control system 400 includes a controller 405. In some cases, for convenience and not by way of limitation, the multi-device control system 400 is referred to as a 2:1 configuration, such as a configuration in which a particular analog switch component provides control for two or fewer IAI devices. In some cases, one or more additional analog switch components are included in the multi-device control system 400, such as additional analog switch components connected (e.g., daisy-chained) to the analog switch component 420.

In FIG. 4, the analog switch component 420 is an octal switch component including eight switches, including switches 431, 432, 433, 434, 435, 436, 437, and 438. In the analog switch component 420, the switch 431 has an input connection point 411a and an output connection point 411b. In addition, the switch 432 has respective input and output connection points 412a and 412b, the switch 433 has respective input and output connection points 413a and 413b, the switch 434 has respective input and output connection points 414a and 414b, the switch 435 has respective input and output connection points 415a and 415b, the switch 436 has respective input and output connection points 416a and 416b, the switch 437 has respective input and output connection points 417a and 417b, and the switch 438 has respective input and output connection points 418a and 418b.

Each of the switches 431-438 is configured to receive, via respective ones of the input connection points 411a-418a, one or more voltage signals. For instance, the input connection points 411a, 414a, 415a, and 418a are configured to receive a first voltage signal $V_A$. In addition, the input connection points 412a, 413a, 416a, and 417a are configured to receive a second voltage signal $V_B$. In FIG. 4, the voltage signals $V_A$ and $V_B$ may be received from a voltage source, such as the voltage source 110 described in regard to FIG. 1. For example, the voltage signals $V_A$ and $V_B$ are a constant (or substantially constant) voltage level, such as +15V and −15V, 15V and 0V, or other suitable voltage levels. FIG. 4 describes the voltage signals $V_A$, and $V_B$ as being constant or substantially constant, but other implementations are possible. For example, a multi-device control system in a 2:1 configuration could receive voltage signals that alternate levels during multiple time periods, such as the voltage signals $V_1$ and $V_2$ described in regard to FIG. 2.

In FIG. 4, the IAI devices 440 and 445 are configured to receive at least one of the voltage signals $V_A$ and $V_B$ at each respective voltage input point, such as via the switches 431-438. For instance, the voltage input point 441 is electrically connected to the output connection points 411*b* and 412*b*. The IAI device 440 is configured to receive, at the voltage input point 441, one or more of the voltage signals $V_A$ and $V_B$ via, respectively, the switches 431 and 432. In addition, the voltage input point 442 is electrically connected to the output connection points 413*b* and 414*b*. The IAI device 440 is configured to receive, at the voltage input point 442, one or more of the voltage signals $V_A$ and $V_B$ via, respectively, the switches 433 and 434. Furthermore, the voltage input point 446 is electrically connected to the output connection points 415*b* and 416*b*. The IAI device 445 is configured to receive, at the voltage input point 446, one or more of the voltage signals $V_A$ and $V_B$ via, respectively, the switches 435 and 436. In addition, the voltage input point 447 is electrically connected to the output connection points 417*b* and 418*b*. The IAI device 445 is configured to receive, at the voltage input point 447, one or more of the voltage signals $V_A$ and $V_B$ via, respectively, the switches 437 and 438.

In the multi-device control system 400, the controller 405 provides to the analog switch component 420 a digital control signal, such as a signal using an SPI communication protocol. Responsive to the digital control signal from the controller 405, the analog switch component 420 modifies states of one or more of the switches 431-438. In some cases, the analog switch component 420 is configured to provide control voltage signals to the IAI devices 440 and 445 via one or more of the switches 431-438. For example, responsive to the digital control signal from the controller 405, the analog switch component 420 modifies the switches 431 and 432, such as opening or closing in an alternating pattern at about 50 Hz. Based on the modified states of the switches 431 and 432, the analog switch component 420 provides the voltage signals $V_A$ or $V_B$, e.g., in an alternating pattern, to the voltage input point 441. In addition, the analog switch component 420 modifies the switches 433 and 434, such that the analog switch component 420 provides the voltage signals $V_A$ or $V_B$ to the voltage input point 442. In some cases, the analog switch component 420 modifies states of the switches 431-434 such that the voltage input points 441 and 442 receive control voltage signals, such as described in regard to FIG. 2. For example, the IAI device 440 activates (e.g., powers on) responsive to receiving control voltage signals that generate a voltage differential across the points 441 and 442, such as receiving, at a particular time period in an alternating signal pattern, the voltage signal $V_A$ via the switch 431 and the voltage signal $V_B$ via the switch 433. In addition, the IAI device 440 deactivates (e.g., powers off) responsive to receiving similar control voltage signals (e.g., a voltage differential that is not sufficient for activation) via the points 441 and 442, such as receiving, at a particular time period in an alternating signal pattern, the voltage signal $V_A$ (or $V_B$) via the switches 431 and 433 (or via the switches 432 and 433). In some cases, the IAI device 440 deactivates responsive to one or more of the voltage input points 441 or 442 being allowed to float (e.g., electrically disconnected).

Responsive to the digital control signal from the controller 405, the analog switch component 420 modifies states of one or more of the switches 435-438. For example, the analog switch component 420 modifies the switches 435 and 436, such that the voltage input point 446 receives a first control voltage signal that is based on the voltage signals $V_A$ or $V_B$. In addition, the analog switch component 420 modifies the switches 437 and 438, such that the voltage input point 447 receives a second control voltage signal that is based on the voltage signals $V_A$ or $V_B$. In some cases, the IAI device 445 activates responsive to receiving, at a particular time period, control voltage signals that generate a voltage differential across the voltage input points 446 and 447, or deactivates (e.g., powers off) responsive to receiving, at a particular time period, similar control voltage signals via the voltage input points 446 and 447, or if one or more of the points 446 or 447 is allowed to float.

In some cases, the analog switch component 420 modifies the switches 435-438 independently of the switches 431-434. For example, the IAI device 445 receives control voltage signals that are different from, similar to, or partly similar to control voltage signals received by the IAI device 440. In the multi-device control system 400, the analog switch component 420 provides individual control to the multiple IAI devices 440 and 445. FIG. 4 describes the analog switch component 420 as providing voltage control signals via the switches 431-438, but other implementations are possible, such as a multi-device control system that provides one or more voltage control signals via a single-pull multi-throw relay, a multiplexer, or another suitable component.

In some implementations, one or more of the voltage signals $V_A$ and $V_B$ are modified via PWM. For instance, the multi-device control system 400 could include a PWM component configured to modify the voltage signals $V_A$ and $V_B$. In addition, the analog switch component 420 (or a PWM component in the system 400) could modify switch states such that one or more of the control voltage signals (e.g., provided via the input connection points 411*b*-418*b*) has a particular voltage level for relatively shorter or longer amounts of time. In some cases, one or more of the IAI devices 440 or 445 modifies an output responsive to receiving a PWM-modified control voltage signal, such as activating a motor or light-emitting component for relatively shorter or longer periods of time.

Figure 5:
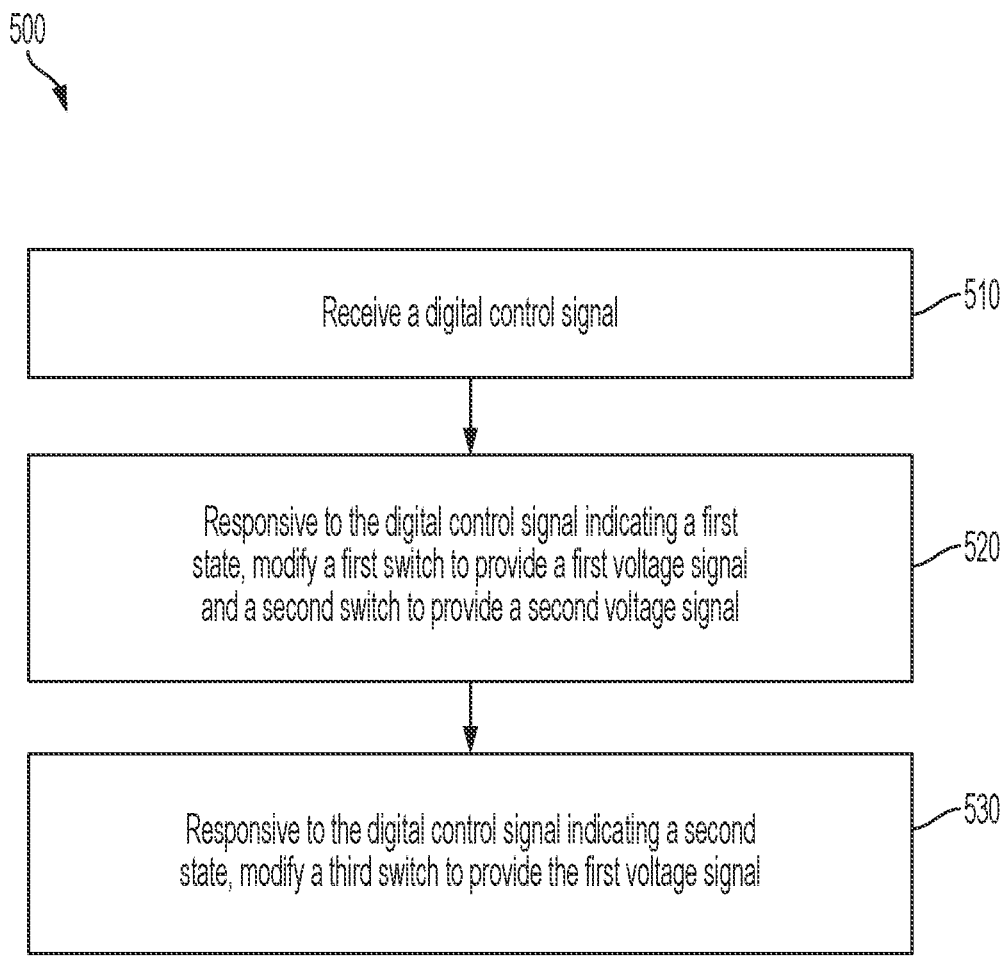
FIG. 5 is a flow chart depicting an example of a process for providing voltage signals to multiple IAI devices, such as in a multi-device control system with a 2:1 configuration, according to certain embodiments.

FIG. 5 is a flow chart depicting an example of a process 500 for providing voltage signals to multiple IAI devices, such as in a multi-device control system with a 2:1 configuration. In some embodiments, such as described in regard to FIGS. 1-4, a processing device implementing a multi-device control system implements operations described in FIG. 5, by executing suitable program code. For illustrative purposes, the process 500 is described with reference to the examples depicted in FIGS. 1-4. Other implementations, however, are possible.

At block 510, the process 500 involves receiving a digital control signal. For example, an analog switch component in a multi-device control system, such as the analog switch component 420, receives a digital control signal from a controller, such as the controller 405. In some cases, the digital control signal includes data indicating one or more states associated with an IAI device that is electrically connected with the analog switch component. For example, the digital control signal received by the analog switch component 420 includes data describing one or more states associated with the IAI device 440 or the IAI device 445.

At block 520, the process 500 involves modifying multiple switches responsive to the digital control signal, such as respective states of a first switch and a second switch. The first and second switches are associated, for instance, with a particular IAI device or a particular voltage input point of the device. In some cases, responsive to the digital control signal indicating a first state of the particular IAI device, the analog switch component modifies the first switch (e.g., switch 431) to provide a first voltage signal to a first voltage input point of the particular IAI device. In addition, the analog switch component modifies the second switch (e.g., switch 433) to provide a second voltage signal to a second voltage input point of the particular IAI device. For example, responsive to the digital control signal indicating a first state (e.g., activated) for the IAI device 440, the analog switch component 420 modifies the switches 431 and 433 to have closed states. In addition, the switches 432 and 434 may be modified to have open states. In some cases, the IAI device 440 receives the first voltage signal $V_A$ via the switch 431 and the second voltage signal $V_B$ via the switch 433.

At block 530, the process 500 involves modifying at least one additional switch responsive to the digital control signal. For example, responsive to the digital control signal indicating a second state of the particular IAI device, the analog switch component may modify a state of a third switch associated with the particular IAI device. For example, responsive to the digital control signal indicating a second state (e.g., deactivated) for the IAI device 440, the analog switch component 420 modifies (at least) the switch 434 to have a closed state. In addition, the switch 433 may be modified to have an open state. In some cases, the IAI device 440 receives the first voltage signal $V_A$ via the switch 431 and via the switch 434.

In some cases, the analog switch component controls the first and second switches such that the particular IAI device does not receive the first voltage signal and second voltage signal at a particular voltage input point during a particular time period. For example, the analog switch component 420 controls the switches 431-438 such that 431 and 432 (or other pairs connected to a particular voltage input point) are not closed during a same time period.

Bus/Inverted Bus Configurations

In some implementations, a multi-device control system includes a signal-generating analog switch component (also referred to herein as a "bus-generating component"). A bus-generating component can be configured to generate one or more voltage signals, such as a signal bus (also referred to herein as a "bus") or an inverted signal bus (also referred to herein as an "inverted bus"). The bus can include a voltage signal having voltage levels that alternate based on a time period, such as a square wave that alternates at a frequency of 50 Hz. In addition, the inverted bus can include a voltage signal having voltage levels that alternate based on the time period of the bus. The voltage levels of the inverted bus can be different from the voltage levels of the bus. For example, a bus and an inverted bus may alternate voltage levels at same (or similar) time periods. In this example, during a first time period, the bus has a relatively high voltage level and the inverted bus has a relatively low voltage level. Continuing in this example, during a second time period immediately subsequent to the first time period, the bus has a relatively low voltage level and the inverted bus has a relatively high voltage level. In some cases, the voltage signals $V_1$ and $V_2$ described in regard to FIG. 2 are examples of a bus and an inverted bus.

In some implementations, the example multi-device control system can include one or more additional analog switch components configured to provide the bus or inverted bus to one or more IAI devices. For example, to activate a particular IAI device, an example analog switch component could provide the bus and inverted bus to respective voltage input points of the particular IAI device. In addition, to deactivate the particular IAI device, the example analog switch component could provide the bus (or the inverted bus) to multiple voltage input points of the particular IAI device. In addition, to deactivate the particular IAI device, the example analog switch component could allow a voltage input point of the particular IAI device to float, such as by opening all switches electrically connected to the voltage input point. In some cases, the example multi-device control system having the bus-generating component can provide control for an increased number of IAI devices by a particular analog switch component, potentially increasing efficiency or decreasing manufacturing costs related to the example multi-device control system. In some cases, a bus/inverted bus signal pair is generated by a bus-generating component and provided to one or more IAI devices via an additional component, such as an analog switch component as described in regard to, at least, FIGS. 6-10.

Figure 6:
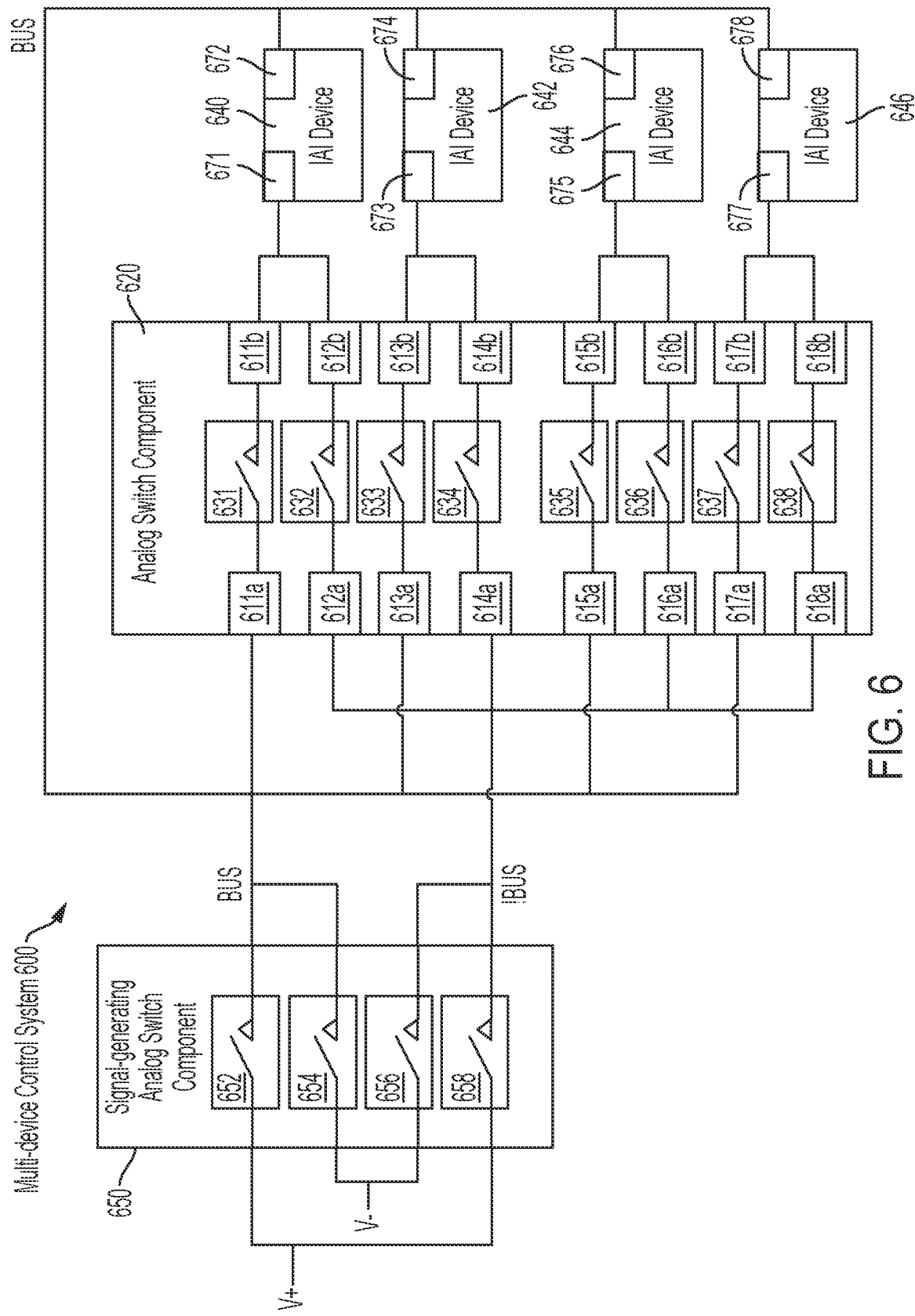
FIG. 6 is a diagram depicting an example of a multi-device control system in which voltage signals generated via a bus-generating component are provided to one or more analog switch components in a 4:1 configuration, according to certain embodiments.

FIG. 6 is a diagram depicting an example of a multi-device control system 600 in which a signal-generating analog switch component (also referred to herein as a "bus-generating component") is configured to generate one or more voltage signals. The voltage signals generated via a particular bus-generating component can be provided to one or more analog switch components in the multi-device control system 600. For example, the multi-device control system 600 includes a signal-generating analog switch component 650 ("bus-generating component 650"). The bus-generating component 650 is configured to generate at least one signal bus and at least one inverted signal bus. In addition, the bus and the inverted bus are provided to at least one analog switch component, such as an analog switch component 620. In some cases, the analog switch component 620 is configured to provide control voltage signals to multiple IAI devices, including an IAI device 640, an IAI device 642, an IAI device 644, and an IAI device 646. In addition, the bus (or the inverted bus) is provided to one or more of the IAI devices 640, 642, 644, or 646. In some cases, for convenience and not by way of limitation, the multi-device control system 600 is referred to as a 4:1 configuration, such as a configuration in which a particular analog switch component provides control for four or fewer IAI devices. In some cases, one or more additional analog switch components are included in the multi-device control system 600, such as additional analog switch components connected (e.g., daisy-chained) to the analog switch component 620.

The bus-generating component 650 may be a switch component including at least four switches, including switches 652, 654, 656, and 658. The switches 652 and 658 are configured to receive a first voltage signal, such as V+. In addition, the switches 654 and 656 are configured to receive a second voltage signal, such as V−. In FIG. 6, the voltage signals V+ and V− may be received from a voltage source, such as the voltage source 110 described in regard to FIG. 1. For example, the voltage signals V+ and V− are a constant (or substantially constant) voltage level, such as +15V and −15V, 15V and 0V, or other suitable voltage levels.

In some implementations, the bus-generating component 650 generates one or more voltage signals by modifying switch states of one or more of the switches 652, 654, 656, or 658. For instance, by opening switch 652 and closing switch 654 during a first time period and closing switch 652 and opening switch 654 during a second (e.g., subsequent) time period, the component 650 generates the signal bus. The signal bus is provided, for example, via a first signal output point of the bus-generating component 650. In the multi-device control system 600, the signal bus includes a voltage signal with multiple voltage levels (e.g., V+ and V−) that alternate at a particular frequency, e.g., 50 Hz. In addition, by opening switch 656 and closing switch 658 during the first time period and closing switch 656 and opening switch 658 during the second time period, the component 650 generates the inverted signal bus. The inverted signal bus is provided, for example, via a second signal output point of the bus-generating component 650. In the multi-device control system 600, the inverted signal bus includes an additional voltage signal with multiple voltage levels that alternate at the particular frequency, such that the bus and inverted bus include different voltage levels (e.g., V+ and V−) during a particular time period. In some cases, the voltage signals $V_1$ and $V_2$ described in regard to FIG. 2 are examples of the bus and the inverted bus generated by the bus-generating component 650. For convenience, and not by way of limitation, FIG. 6 may identify the bus and inverted bus generated by the component 650 as BUS and !BUS, respectively.

In some cases, the bus-generating component 650 is an octal switch component that includes eight switches. In some implementations, the bus-generating component 650 is configured to generate multiple buses or inverted buses. For example, in addition to the bus and inverted bus described above in regard to FIG. 6, the bus-generating component 650 could be configured to generate, via additional switches of the octal switch component, an additional bus and an additional inverted bus. The example additional bus and additional inverted bus may, but need not, have characteristics that are similar to, different from, or partly similar to characteristics of the example bus and inverted bus. For instance, the additional bus and additional inverted bus may have additional voltage levels, alternate at an additional frequency, or have other characteristics that vary from characteristics of the bus and inverted bus. In some cases, the bus-generating component 650 is configured to provide multiple bus/inverted bus signal pairs to multiple types of IAI devices via multiple analog switch components. For example, the bus-generating component 650 provides the bus and inverted bus to a group of PDLC IAI devices (e.g., devices 640, 642, 644, and 646). In addition, the bus-generating component 650 could provide the additional bus and additional inverted bus to a group of speaker IAI devices.

In FIG. 6, the analog switch component 620 is an octal switch component including eight switches, including switches 631, 632, 633, 634, 635, 636, 637, and 638. In the analog switch component 620, the switch 631 has an input connection point 611*a* and an output connection point 611*b*. In addition, the switch 632 has respective input and output connection points 612*a* and 612*b*, the switch 633 has respective input and output connection points 613*a* and 613*b*, the switch 634 has respective input and output connection points 614*a* and 614*b*, the switch 635 has respective input and output connection points 615*a* and 615*b*, the switch 636 has respective input and output connection points 616*a* and 616*b*, the switch 637 has respective input and output connection points 617*a* and 617*b*, and the switch 638 has respective input and output connection points 618*a* and 618*b*.

Each of the switches 631-638 is configured to receive, via respective ones of the input connection points 611*a*-618*a*, one or more voltage signals. For instance, the input connection points 611*a*, 613*a*, 615*a*, and 617*a* are configured to receive the signal bus (e.g., BUS). In addition, the input connection points 612*a*, 614*a*, 616*a*, and 618*a* are configured to receive the inverted bus (e.g., !BUS).

In FIG. 6, the IAI devices 640, 642, 644, and 646 are configured to receive at least one of the bus or the inverted bus at a respective voltage input point. In addition, the IAI devices 640, 642, 644, and 646 are configured to receive the bus at an additional respective voltage input point. In FIG. 6, the IAI devices 640, 642, 644, and 646 are described as receiving the signal bus at an additional respective voltage input point, but other implementations are possible, such as a multi-device control system in which one or more IAI devices are configured to receive an inverted signal bus at respective voltage input points.

The IAI device 640 has, for example, a voltage input point 671 and a voltage input point 672. The voltage input point 671 is electrically connected to the output connection points 611*b* and 612*b*. The IAI device 640 is configured to receive, at the voltage input point 671, one or more of the bus or inverted bus via, respectively, the switches 631 and 632. In addition, the voltage input point 672 is electrically connected to the bus-generating component 650. The IAI device 640 is configured to receive, at the voltage input point 672, the signal bus from the bus-generating component 650.

Furthermore, the IAI device 642 has a voltage input point 673 that is electrically connected to the output connection points 613*b* and 614*b*, and a voltage input point 674 that is electrically connected to the bus-generating component 650. The IAI device 642 is configured to receive, at the voltage input point 673, one or more of the bus or the inverted bus via, respectively, the switches 633 and 634. In addition, the IAI device 642 is configured to receive, at the voltage input point 674, the signal bus from the bus-generating component 650.

Furthermore, the IAI device 644 has a voltage input point 675 that is electrically connected to the output connection points 615*b* and 616*b*, and a voltage input point 676 that is electrically connected to the bus-generating component 650. The IAI device 644 is configured to receive, at the voltage input point 675, one or more of the bus or the inverted bus via, respectively, the switches 635 and 636. In addition, the IAI device 644 is configured to receive, at the voltage input point 676, the signal bus from the bus-generating component 650.

Furthermore, the IAI device 646 has a voltage input point 677 that is electrically connected to the output connection points 617*b* and 618*b*, and a voltage input point 678 that is electrically connected to the bus-generating component 650. The IAI device 646 is configured to receive, at the voltage input point 677, one or more of the bus or the inverted bus via, respectively, the switches 637 and 638. In addition, the IAI device 646 is configured to receive, at the voltage input point 678, the signal bus from the bus-generating component 650.

In the multi-device control system 600, one or more of the bus-generating component 650 or the analog switch component 620 receives a digital control signal, such as a signal using an SPI communication protocol. The digital control signal (or signals) can be received from at least one controller, such as the controller 105. For example, the bus-generating component 650 generates the bus and inverted bus responsive to a first digital control signal received from the controller, such as by modifying states of one or more of the switches 652, 654, 656, or 658. In addition, the analog switch component 620 modifies states of one or more of the switches 631-638 responsive to one or more of the first digital control signal or a second digital control signal from the controller (or an additional controller).

In some cases, the analog switch component 620 is configured to provide control voltage signals to the IAI devices 640, 642, 644, and 646 via one or more of the switches 631-638. For example, responsive to the digital control signal indicating a particular state of the IAI device 640, the analog switch component 620 modifies the switches 631 and 632. Based on the modified states of the switches 631 and 632, the analog switch component 620 provides to the voltage input point 671 a control voltage signal that is based on the bus or the inverted bus. The voltage input point 671 receives a control voltage signal that is similar to (e.g., the bus) or different from (e.g., the inverted bus) the bus received at the voltage input point 672. For example, the IAI device 640 enters a first state (e.g., activates) responsive to receiving control voltage signals that generate a voltage differential across the voltage input points 671 and 672, such as receiving the signal bus from the bus-generating component 650 and the inverted signal bus via the switch 632. In addition, the IAI device 640 enters a second state (e.g., deactivates) responsive to receiving similar control voltage signals (e.g., a voltage differential that is not sufficient for activation) via the voltage input points 671 and 672, such as receiving the signal bus from the bus-generating component 650 and via the switch 631. In some cases, the IAI device 640 enters the second state responsive to one or more of the voltage input points 671 or 672 being allowed to float (e.g., electrically disconnected).

Responsive to the digital control signal, the analog switch component 620 modifies states of one or more of the switches 631-638. For example, the analog switch component 620 modifies the switches 633 and 634, such that the voltage input point 673 receives a first control voltage signal that is based on the bus or the inverted bus. In some cases, the IAI device 642 enters a first state responsive to receiving control voltage signals that generate a voltage differential across the voltage input points 673 and 674, such as receiving the signal bus from the bus-generating component 650 and the inverted signal bus via the switch 634. In addition, the IAI device 642 enters a second state responsive to receiving similar control voltage signals (e.g., a voltage differential that is not sufficient for activation) via the voltage input points 673 and 674, such as receiving the signal bus from the bus-generating component 650 and via the switch 633. In some cases, the IAI device 642 enters the second state responsive to one or more of the voltage input points 673 or 674 being allowed to float.

In addition, the analog switch component 620 modifies the switches 635 and 636, such that the voltage input point 675 receives a first control voltage signal that is based on the bus or the inverted bus. In some cases, the IAI device 644 enters a first state responsive to receiving control voltage signals that generate a voltage differential across the voltage input points 675 and 676, such as receiving the signal bus from the bus-generating component 650 and the inverted signal bus via the switch 636. In addition, the IAI device 644 enters a second state responsive to receiving similar control voltage signals via the voltage input points 675 and 676, such as receiving the signal bus from the bus-generating component 650 and via the switch 635. In some cases, the IAI device 644 enters the second state responsive to one or more of the voltage input points 675 or 676 being allowed to float.

Furthermore, the analog switch component 620 modifies the switches 637 and 638, such that the voltage input point 677 receives a first control voltage signal that is based on the bus or the inverted bus. In some cases, the IAI device 646 enters a first state responsive to receiving control voltage signals that generate a voltage differential across the voltage input points 677 and 678, such as receiving the signal bus from the bus-generating component 650 and the inverted signal bus via the switch 638. In addition, the IAI device 646 enters a second state responsive to receiving similar control voltage signals via the voltage input points 677 and 678, such as receiving the signal bus from the bus-generating component 650 and via the switch 637. In some cases, the IAI device 646 enters the second state responsive to one or more of the voltage input points 677 or 678 being allowed to float.

In some cases, the analog switch component 620 modifies each of the switches 631-638 independently of additional ones of the switches 631-638. For example, each of the IAI devices 640, 642, 644, and 646 receives control voltage signals that are different from, similar to, or partly similar to control voltage signals received by additional ones of the IAI devices 640, 642, 644, and 646. In the multi-device control system 600, the analog switch component 620 provides individual control to the multiple IAI devices 640, 642, 644, and 646. FIG. 6 describes the analog switch component 620 as providing voltage control signals via the switches 631-638, but other implementations are possible, such as a multi-device control system that provides one or more voltage control signals via a single-pull multi-throw relay, a multiplexer, or another suitable component.

In some implementations, the bus-generating component 650 is configured to provide the bus and inverted bus to one or more additional analog switch components, such as additional analog switch components that are connected (e.g., daisy-chained) to the component 620. In some cases, a multi-device control system that is configured to provide a bus and inverted bus to multiple analog switch components provides control to multiple IAI devices with improved efficiency, such as by reducing a quantity of inputs or components related to generating control voltage signals.

In some implementations, one or more of the bus or inverted bus are modified via PWM. For instance, the multi-device control system 600 could include a PWM component configured to modify the bus or inverted bus. In addition, the analog switch component 620 (or a PWM component in the system 600) could modify switch states such that one or more of the control voltage signals (e.g., provided via the input connection points 611*b*-618*b*) has a particular voltage level for relatively shorter or longer amounts of time. In some cases, one or more of the IAI devices 640, 642, 644, or 646 modifies an output responsive to receiving a PWM-modified control voltage signal, such as activating a motor or light-emitting component for relatively shorter or longer periods of time.

Figure 7:
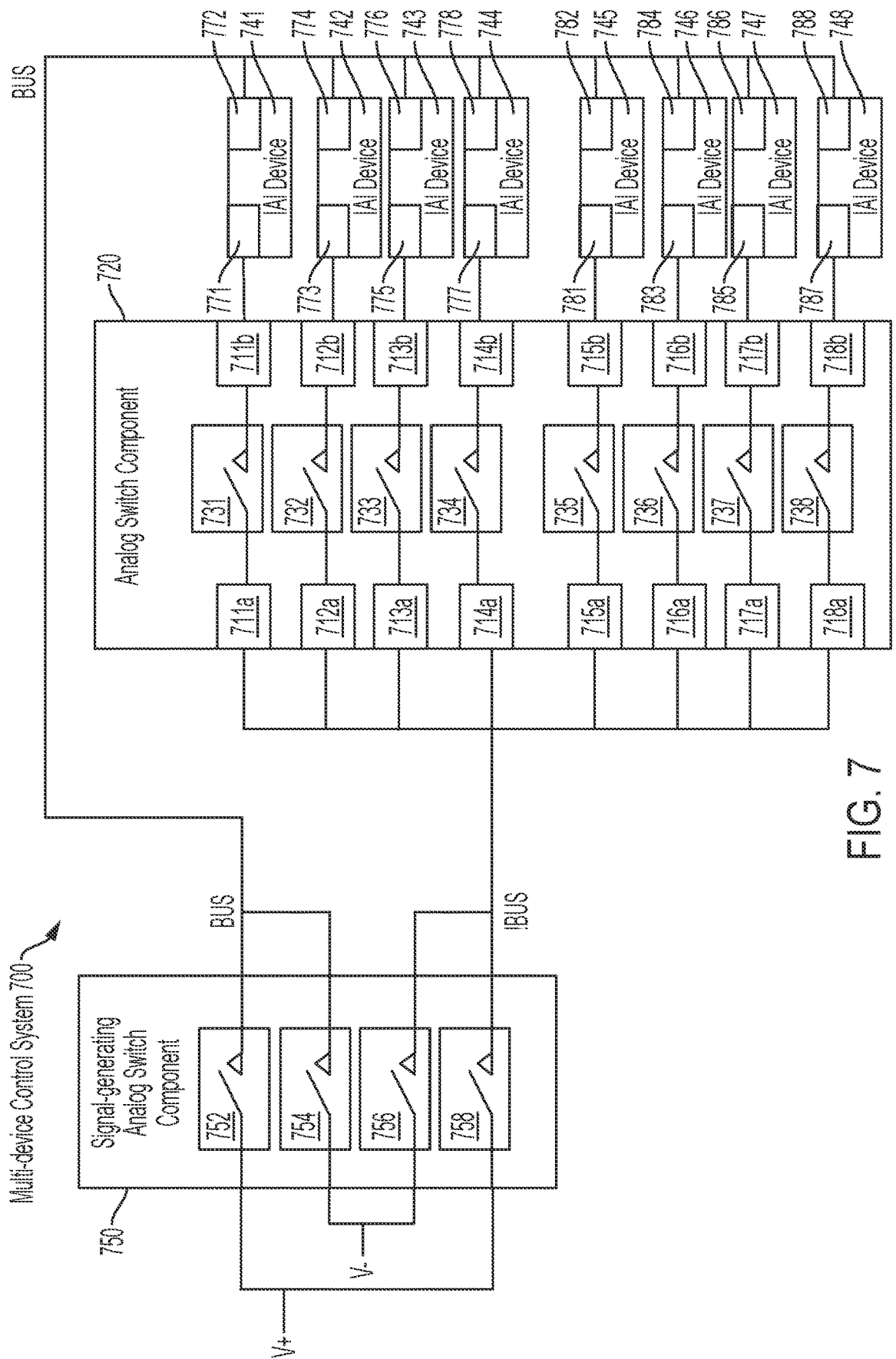
FIG. 7 is a diagram depicting an example of a multi-device control system in which voltage signals generated via a bus-generating component are provided to one or more analog switch components in an 8:1 configuration, according to certain embodiments.

FIG. 7 is a diagram depicting an example of a multi-device control system 700 in which a signal-generating analog switch component is configured to generate one or more voltage signals. The voltage signals generated via a particular bus-generating component can be provided to one or more analog switch components in the multi-device control system 700. For example, the multi-device control system 700 includes a signal-generating analog switch component 750 ("bus-generating component 750"). The bus-generating component 750 is configured to generate at least one signal bus and at least one inverted signal bus. In addition, at least one of the bus or the inverted bus is provided to at least one analog switch component, such as an analog switch component 720. In some cases, the analog switch component 720 is configured to provide control voltage signals to multiple IAI devices, including IAI devices 741, 742, 743, 744, 745, 746, 747, and 748. In addition, the bus (or the inverted bus) is provided to one or more of the IAI devices 741-748. In some cases, for convenience and not by way of limitation, the multi-device control system 700 is referred to as an 8:1 configuration, such as a configuration in which a particular analog switch component provides control for eight or fewer IAI devices. In some cases, one or more additional analog switch components are included in the multi-device control system 700, such as additional analog switch components connected (e.g., daisy-chained) to the analog switch component 720.

The bus-generating component 750 may be a switch component including at least four switches, including switches 752, 754, 756, and 758. The switches 752 and 758 are configured to receive a first voltage signal, such as V+. In addition, the switches 754 and 756 are configured to receive a second voltage signal, such as V−. In FIG. 7, the voltage signals V+ and V− may be received from a voltage source, such as the voltage source 110 described in regard to FIG. 1. For example, the voltage signals V+ and V− are a constant (or substantially constant) voltage level, such as +15V and −15V, 15V and 0V, or other suitable voltage levels.

In some implementations, the bus-generating component 750 generates one or more voltage signals by modifying switch states of one or more of the switches 752, 754, 756, or 758. For instance, by opening switch 752 and closing switch 754 during a first time period and closing switch 752 and opening switch 754 during a second (e.g., subsequent) time period, the component 750 generates the signal bus. The signal bus is provided, for example, via a first signal output point of the bus-generating component 750. In the multi-device control system 700, the signal bus includes a voltage signal with multiple voltage levels (e.g., V+ and V−) that alternate at a particular frequency, e.g., 50 Hz. In addition, by opening switch 756 and closing switch 758 during the first time period and closing switch 756 and opening switch 758 during the second time period, the component 750 generates the inverted signal bus. The signal bus is provided, for example, via a second signal output point of the bus-generating component 750. In the multi-device control system 700, the inverted signal bus includes an additional voltage signal with multiple voltage levels that alternate at the particular frequency, such that the bus and inverted bus include different voltage levels (e.g., V+ and V−) during a particular time period. In some cases, the voltage signals $V_1$ and $V_2$ described in regard to FIG. 2 are examples of the bus and the inverted bus generated by the bus-generating component 750. For convenience, and not by way of limitation, FIG. 7 may identify the bus and inverted bus generated by the component 750 as BUS and !BUS, respectively.

In some cases, the bus-generating component 750 is an octal switch component that includes eight switches. In some implementations, the bus-generating component 750 is configured to generate multiple buses or inverted buses. For example, in addition to the bus and inverted bus described above in regard to FIG. 7, the bus-generating component 750 could be configured to generate, via additional switches of the octal switch component, an additional bus and an additional inverted bus. The example additional bus and additional inverted bus may, but need not, have characteristics that are similar to, different from, or partly similar to characteristics of the example bus and inverted bus, such as additional voltage level characteristics, additional frequency characteristics, or other suitable characteristics that vary from characteristics of the bus and inverted bus. In some cases, the bus-generating component 750 is configured to provide multiple bus/inverted bus signal pairs to multiple types of IAI devices via multiple analog switch components, such as generally described in regard to FIG. 6.

In FIG. 7, the analog switch component 720 is an octal switch component including eight switches, including switches 731, 732, 733, 734, 735, 736, 737, and 738. In the analog switch component 720, the switch 731 has an input connection point 711*a* and an output connection point 711*b*. In addition, the switch 732 has respective input and output connection points 712*a* and 712*b*, the switch 733 has respective input and output connection points 713*a* and 713*b*, the switch 734 has respective input and output connection points 714*a* and 714*b*, the switch 735 has respective input and output connection points 715*a* and 715*b*, the switch 736 has respective input and output connection points 716*a* and 716*b*, the switch 737 has respective input and output connection points 717*a* and 717*b*, and the switch 738 has respective input and output connection points 718*a* and 718*b*.

Each of the switches 731-738 is configured to receive, via the input connection points 711*a*-718*a*, one or more voltage signals. For instance, the input connection points 711*a*-718*a* are configured to receive the inverted bus (e.g., !BUS). In addition, the IAI devices 741-748 are configured to receive the bus at a respective voltage input point, and the inverted bus at an additional respective voltage input point. In FIG. 7, the IAI devices 741-748 are described as receiving, at a respective voltage input point, the signal bus from the bus-generating component 750 and the inverted bus at an additional respective voltage input point via the switches 731-738. However, other implementations are possible, such as a multi-device control system in which one or more IAI devices are configured to receive an inverted signal bus from a bus-generating component and a signal bus via one or more switches in an analog switch component.

The IAI device 741 has, for example, a voltage input point 771 and a voltage input point 772. The voltage input point 771 is electrically connected to the output connection point 711*b*. The IAI device 741 is configured to receive, at the voltage input point 771, the inverted bus via the switch 731. In addition, the voltage input point 772 is electrically connected to the bus-generating component 750. The IAI device 741 is configured to receive, at the voltage input point 772, the bus from the bus-generating component 750. In addition, each of the IAI devices 742, 743, 744, 745, 746, 747, and 748 has a respective voltage input point 773, 775, 777, 781, 783, 785, and 787 that is electrically connected to the respective output connection point 712*b*, 713*b*, 714*b*, 715*b*, 716*b*, 717*b*, and 718*b*. Each of the IAI devices 742, 743, 744, 745, 746, 747, and 748 is configured to receive the inverted bus via, respectively, the switch 732, 733, 734, 735, 736, 737, and 738. Furthermore, each of the IAI devices 742, 743, 744, 745, 746, 747, and 748 has a respective voltage input point 774, 776, 778, 782, 784, 786, and 788 that is electrically connected to the bus-generating component 750. Each of the IAI devices 742, 743, 744, 745, 746, 747, and 748 is configured to receive the signal bus from the bus-generating component 750, at the respective voltage input point 774, 776, 778, 782, 784, 786, and 788.

In the multi-device control system 700, one or more of the bus-generating component 750 or the analog switch component 720 receives a digital control signal, such as a signal using an SPI communication protocol. The digital control signal (or signals) can be received from at least one controller, such as the controller 105. For example, the bus-generating component 750 generates the bus and inverted bus responsive to a first digital control signal received from the controller, such as by modifying states of one or more of the switches 752, 754, 756, or 758. In addition, the analog switch component 720 modifies states of one or more of the switches 731-738 responsive to a second digital control signal from the controller (or an additional controller).

In some cases, the analog switch component 720 is configured to provide control voltage signals to the IAI devices 741-748 via one or more of the switches 731-738. For example, responsive to the digital control signal indicating a particular state of the IAI device 741, the analog switch component 720 modifies the switch 731. Based on the modified state of the switch 731, the analog switch component 720 provides to the voltage input point 771 a control voltage signal that is based on the inverted bus. If, for instance, the switch 731 is closed, the voltage input point 771 receives a control voltage signal that includes the inverted bus, e.g., alternating voltage levels that are different from the bus received at the voltage input point 772. If the switch 731 is open, the voltage input point 771 is electrically disconnected (e.g., floating). For example, the IAI device 741 enters a first state (e.g., activates) responsive to receiving control voltage signals that generate a voltage differential across the points 771 and 772, such as receiving the signal bus from the bus-generating component 650 and the inverted signal bus via the switch 731. In addition, the IAI device 741 enters a second state (e.g., deactivates) responsive to having an electrically disconnected voltage input point, such as a floating voltage at the point 771 based on the switch 731 being open.

Responsive to the digital control signal, the analog switch component 720 modifies states of one or more of the switches 731-738. For example, the analog switch component 720 modifies one or more of the switches 732-738, such that the respective voltage input points 773, 775, 777, 781, 783, 785, and 787 receive a first control voltage signal that is based on the inverted bus or an electrically disconnected state. In some cases, one or more of the IAI devices 742-748 enters a respective first state responsive to receiving the signal bus from the bus-generating component 750 and the inverted signal bus via a respective voltage input point. In addition, one or more of the IAI devices 742-748 enters a respective second state responsive to receiving the signal bus from the bus-generating component 750 and being electrically disconnected (e.g., floating) at the respective voltage input point.

In some cases, the analog switch component 720 modifies each of the switches 731-738 independently of additional ones of the switches 731-738. For example, each of the IAI devices 741-748 receives control voltage signals that are different from, similar to, or partly similar to control voltage signals received by additional ones of the IAI devices 741-748. In the multi-device control system 700, the analog switch component 720 provides individual control to the multiple IAI devices 741-748. FIG. 7 describes the analog switch component 720 as providing voltage control signals via the switches 731-738, but other implementations are possible, such as a multi-device control system that provides one or more voltage control signals via a single-pull multi-throw relay, a multiplexer, or another suitable component.

In some implementations, one or more of the bus or the inverted bus are modified via PWM. For instance, the multi-device control system 700 could include a PWM component configured to modify the bus or inverted bus. In addition, the analog switch component 720 (or a PWM component in the system 700) could modify switch states such that one or more of the control voltage signals (e.g., provided via the input connection points 711b-718b) has a particular voltage level for relatively shorter or longer amounts of time. In some cases, one or more of the IAI devices 741-748 modifies an output responsive to receiving a PWM-modified control voltage signal, such as activating a motor or light-emitting component for relatively shorter or longer periods of time.

In some implementations, the bus-generating component 750 is configured to provide the bus and inverted bus to one or more additional analog switch components, such as additional analog switch components that are connected (e.g., daisy-chained) to the component 720. In some cases, a multi-device control system that is configured to provide a bus and inverted bus to multiple analog switch components provides control to multiple IAI devices with improved efficiency, such as by reducing a quantity of inputs or components related to generating control voltage signals.

In some implementations, a multi-device control system that is configured to provide a control voltage signal based on a combination of a bus, an inverted bus, and an electrically disconnected state provides control to multiple IAI devices with improved efficiency, such as by controlling one IAI device per switch of an analog switch component. In addition, the example control voltage signal based on the bus, inverted bus, and electrically disconnected state can provide control to types of IAI devices that change state (e.g., activating, deactivating) relatively slowly compared to a frequency of the example control voltage signal. For instance, if the example control voltage signal includes a bus and inverted bus that alternate at a frequency of 50 Hz, the example control voltage signal could control an IAI device that changes state relatively slowly compared to the example 50 Hz frequency, such as more slowly than 20 msec.

Figure 8:
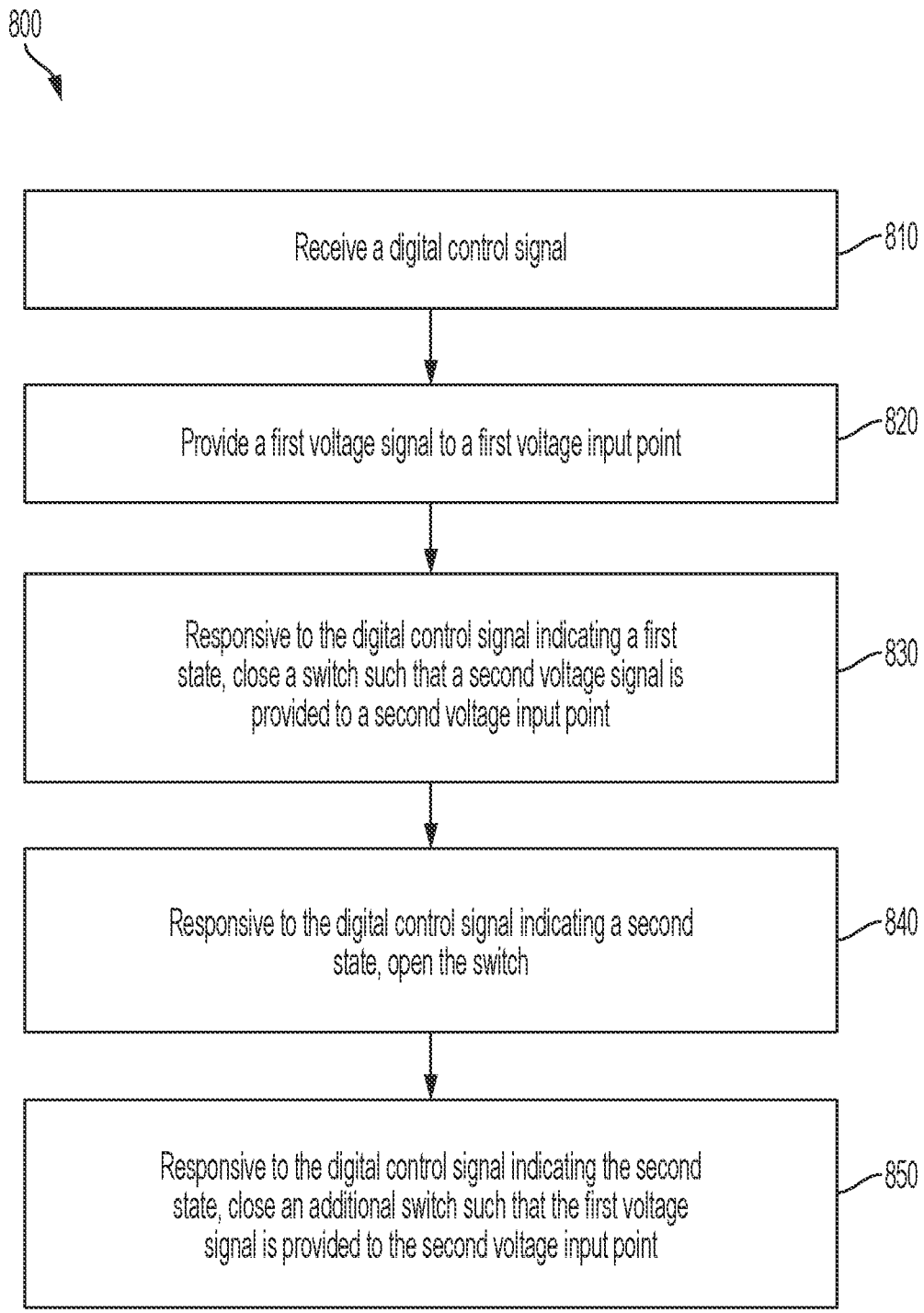
FIG. 8 is a flow chart depicting an example of a process for providing voltage signals to multiple IAI devices, such as in a multi-device control system with a 4:1 configuration or an 8:1 configuration, according to certain embodiments.

FIG. 8 is a flow chart depicting an example of a process 800 for providing voltage signals to multiple IAI devices, such as voltage signals that are based on one or more of a signal bus or an inverted signal bus. In some cases, the process 800 is implemented in a multi-device control system with a 4:1 configuration or a multi-device control system with an 8:1 configuration. In some embodiments, such as described in regard to FIGS. 1-7, a processing device implementing a multi-device control system implements operations described in FIG. 8, by executing suitable program code. For illustrative purposes, the process 800 is described with reference to the examples depicted in FIGS. 1-7. Other implementations, however, are possible.

At block 810, the process 800 involves receiving a digital control signal. For example, an analog switch component in a multi-device control system, such as the analog switch components 620 or 720, receives a digital control signal from a controller. In some cases, the digital control signal includes data indicating one or more states associated with an IAI device that is electrically connected with the analog switch component. For example, the digital control signal received by the analog switch component 620 includes data describing one or more states associated with the IAI devices 640, 642, 644, or 646. In addition, the digital control signal received by the analog switch component 720 includes data describing one or more states associated with the IAI devices 741-748.

At block 820, the process 800 involves providing a first control voltage signal to a first voltage input point, such as a first voltage input point of a particular IAI device. The first control voltage signal is based on, for example, a signal bus or an inverted signal bus, such as a bus or inverted bus generated via a bus-generating component. In addition, the first control voltage signal is provided to the particular IAI device via an electrical connection to a first input connection point of the analog switch component. For example, the voltage input point 672 is electrically connected to the input connection point 611a and a first signal output point of the bus-generating component 650. In addition, the bus generated by the bus-generating component 650 is provided to the voltage input point 672 via the electrical connection with the first signal output point and the point 611*a*.

In some cases, such as in a multi-device control system with an 8:1 configuration, the first voltage input point receives the first control voltage signal via an electrical connection with the bus-generating component. For example, the voltage control point 772 receives the bus via an electrical connection with a first signal output point of the bus-generating component 750. In addition, the voltage control point 772 is electrically disconnected from the input connections points 711*a*-718*a* of the analog switch component 720.

At block 830, the process 800 involves modifying one or more switches responsive to the digital control signal, such as a state of (at least) a first switch. The first switch is associated, for instance, with the particular IAI device. In some cases, responsive to the digital control signal indicating a first state of the particular IAI device, the analog switch component modifies the first switch to provide a second voltage signal to a second voltage input point of the particular IAI device. For example, responsive to the digital control signal indicating a first state (e.g., activated) for the IAI device 640, the analog switch component 620 modifies the switch 632 to have a closed state. In the first state, for example, the IAI device 640 receives the first voltage signal BUS via the voltage input point 672 and the second voltage signal !BUS via the switch 632. In addition, responsive to the digital control signal indicating a first state for the IAI device 741, the analog switch component 720 modifies the switch 731 to have a closed state. In the first state, for example, the IAI device 741 receives the first voltage signal BUS via the voltage input point 772 and the second voltage signal !BUS via the switch 731.

In some cases, one or more additional switches are modified responsive to the digital control signal indicating the first state of the particular IAI device, such as modifying a second switch to have an open state. For example, responsive to the digital control signal indicating the first state for the IAI device 640, the analog switch component 620 modifies the switch 631 to have an open state.

At block 840, the process 800 involves modifying the state of (at least) the first switch, responsive to the digital control signal. For example, responsive to the digital control signal indicating a second state of the particular IAI device, the analog switch component modifies the first switch such that the second voltage input point is electrically disconnected, e.g., from the bus-generating component. For example, responsive to the digital control signal indicating a second state (e.g., deactivated) for the IAI device 640, the analog switch component 620 modifies the switch 632 to have an open state. In the second state, for example, the IAI device 640 receives the first voltage signal BUS via the voltage input point 672 and is disconnected from the second voltage signal !BUS via the switch 632. In addition, responsive to the digital control signal indicating a second state for the IAI device 741, the analog switch component 720 modifies the switch 731 to have an open state. In the second state, for example, the IAI device 741 receives the first voltage signal BUS via the voltage input point 772 and is disconnected from the second voltage signal !BUS via the switch 731.

In some cases, one or more additional switches are modified responsive to the digital control signal indicating the second state of the particular IAI device, such as modifying the second switch to have a closed state. At block 850, the process 800 involves modifying the state of an additional switch, such as the second switch, responsive to the digital control signal. For example, responsive to the digital control signal indicating the second state of the particular IAI device, the analog switch component modifies the second switch such that the first voltage signal is received by the second voltage input point. For example, responsive to the digital control signal indicating the second state for the IAI device 640, the analog switch component 620 modifies the switch 631 to have a closed state. In the second state, for example, the IAI device 640 receives the first voltage signal BUS via the voltage input point 672 and via the switch 631. In some cases, one or more operations related to block 850 are optional, such as in a multi-device control system with an 8:1 configuration.

In some cases, the analog switch component controls the one or more switches such that the particular IAI device does not receive the first voltage signal and second voltage signal at a particular voltage input point during a particular time period. For example, the analog switch component 620 controls the switches 631-638 such that switches 631 and 632 (or other pairs connected to a particular voltage input point) are not closed during a same time period.

Neighbor Control Configuration

In some implementations, multiple IAI devices are arranged in a particular physical configuration. For example, the IAI devices could be arranged in a relatively dense array (or other arrangement), such that relatively little space is present between the IAI devices. In the particular physical configuration, such as the example dense array, there may be manufacturing difficulties, performance difficulties, or other adverse conditions related to physical constraints of each of the multiple IAI devices. For example, electrical connections with a clip form (or other form factor) may require more space between each IAI device than is available in the example dense array. Other physical constraints could include, without limitation, structural components (e.g., a firm backing for a relatively flexible device), attachment components to affix an IAI device to fabric, bending radii of flexible devices or flexible electrical connections, or other suitable constraints. In some cases, a particular type of IAI device is associated with one or more particular constraints. For example, a particular type of PDLC device could require clip-type electrical connections, while a particular type of piezoelectric device could require a minimum bending radius. Additional physical constraints may be associated with these or additional types of IAI devices.

In some cases, a multi-device control system provides control to multiple IAI devices having a particular physical configuration in which relatively little space is present between the IAI devices. The multi-device control system can be configured to provide one or more voltage signals (e.g., $V_A$ and $V_B$, bus and inverted bus) to electrical connection points that are shared between or among multiple IAI devices. In some examples described herein, two or more IAI devices that share an electrical connection via respective voltage input points are referred to as "neighbor IAI devices." For example, a first IAI device can be electrically connected to a second IAI device, such as an electrical connection between a first voltage input point of the first device and a second voltage input point of the second device. An analog switch component can be configured to provide a control voltage signal to the first IAI device and the second IAI device via the shared electrical connection, such that the example signal is received by the first voltage input point and the second voltage input point. In addition, additional control voltage signals are provided to additional voltage input points of the first and second IAI devices. In some cases, states of the first and second IAI devices can be controlled based on similarities, differences, or partial similarities of control voltage signals received by the voltage input points. For example, if the second IAI device receives a signal bus via the second voltage input point, e.g., at the shared electrical connection with the first voltage input point, the second IAI device could enter an activated state responsive to receiving an inverted signal bus at an additional voltage input point. Additional IAI devices could be connected (e.g., daisy-chained) to the second IAI device, such as a third IAI device that shares an electrical connection with the second IAI device at the additional voltage input point.

In some implementations, the example multi-device control system that is configured to provide a voltage signal to neighbor IAI devices via a shared electrical connection can improve performance of the multiple IAI devices in the particular physical configuration. For example, the shared electrical connection could reduce a quantity of electrical connection components utilized in the particular physical configuration. In addition, reducing the quantity of electrical connection components could increase the quantity of IAI devices that can be physically arranged within a particular physical space. In addition, reducing the quantity of electrical connection components could reduce manufacturing costs related to the example multi-device control system, such as costs for purchasing the electrical connection components.

Figure 9:
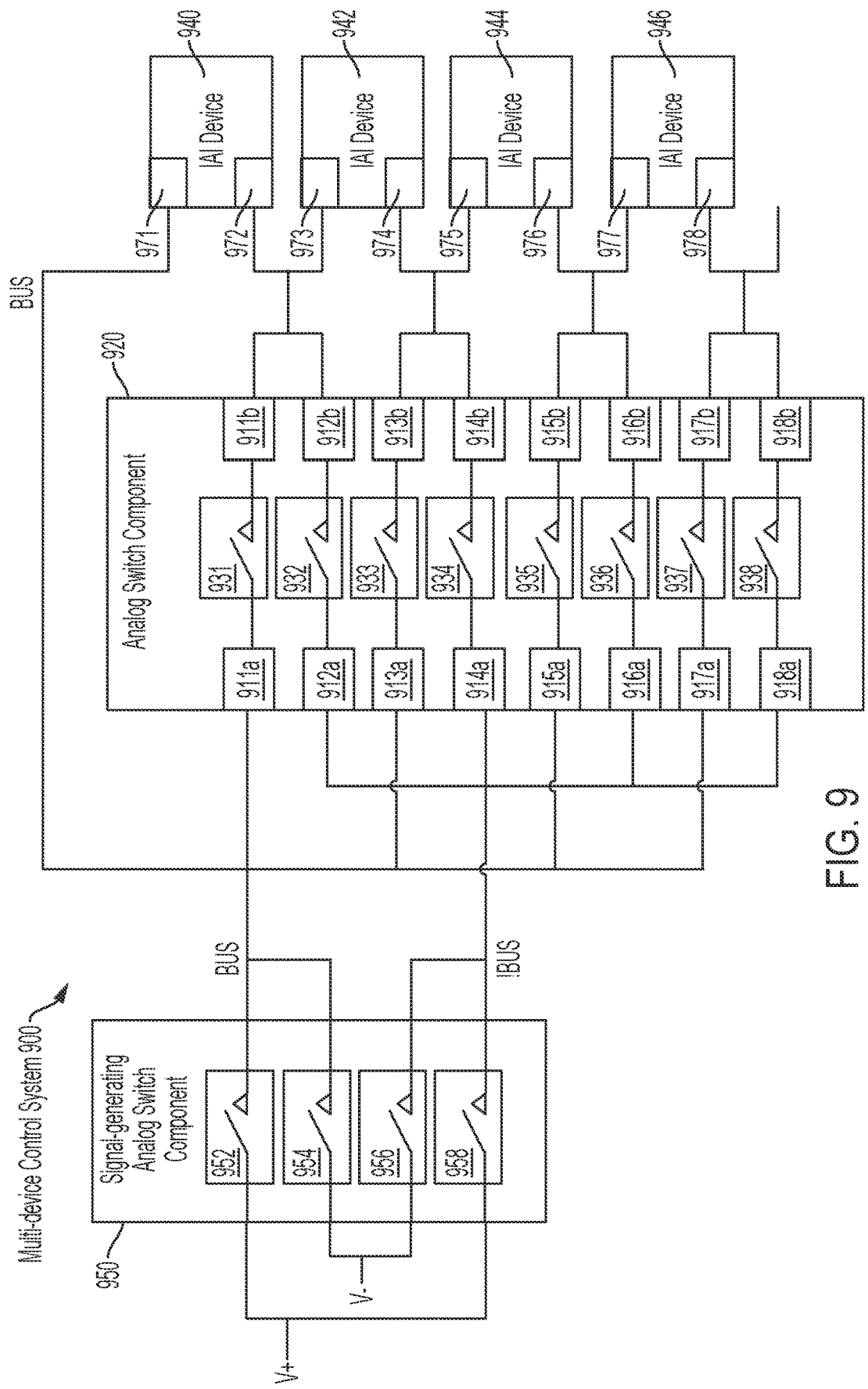
FIG. 9 is a diagram depicting an example of a multi-device control system configured to control multiple IAI devices utilizing a neighbor control configuration, according to certain embodiments.

FIG. 9 is a diagram depicting an example of a multi-device control system 900 that is configured to control neighbor IAI devices. The multi-device control system 900 includes a signal-generating analog switch component 950 ("bus-generating component 950"). The bus-generating component 950 is configured to generate at least one signal bus and at least one inverted signal bus. In addition, the bus and the inverted bus are provided to at least one analog switch component, such as an analog switch component 920. In some cases, the analog switch component 920 is configured to provide control voltage signals to multiple IAI devices, including an IAI device 940, an IAI device 942, an IAI device 944, and an IAI device 946. In addition, the bus (or the inverted bus) is provided to one or more of the IAI devices 940, 942, 944, or 946. In some cases, for convenience and not by way of limitation, the multi-device control system 900 is referred to as a configuration having neighbor control, such as a configuration in which an analog switch component provides a particular control voltage signal to a pair (or more) of neighbor IAI devices via a shared electrical connection. In some cases, one or more additional analog switch components are included in the multi-device control system 900, such as additional analog switch components connected (e.g., daisy-chained) to the analog switch component 920. The multi-device control system 900 is depicted as a 4:1 configuration, but other implementations are possible, such as a 2:1 configuration with neighbor control.

The bus-generating component 950 may be a switch component including at least four switches, including switches 952, 954, 956, and 958. The switches 952 and 958 are configured to receive a first voltage signal, such as V+. In addition, the switches 954 and 956 are configured to receive a second voltage signal, such as V−. In FIG. 9, the voltage signals V+ and V− may be received from a voltage source, such as the voltage source 110 described in regard to FIG. 1. For example, the voltage signals V+ and V− are a constant (or substantially constant) voltage level, such as +15V and −15V, 15V and 0V, or other suitable voltage levels. In some implementations, the bus-generating component 950 generates one or more voltage signals by modifying switch states of one or more of the switches 952, 954, 956, or 958, such as described above in regard to (at least) FIG. 6. In FIG. 9, the generated voltage signals include a signal bus and an inverted signal bus. The signal bus and inverted signal bus are respectively provided, for example, via a first signal output point and a second signal output point of the bus-generating component 950. In the multi-device control system 900, the signal bus includes a voltage signal with multiple voltage levels (e.g., V+ and V−) that alternate at a particular frequency, e.g., 50 Hz. In the multi-device control system 900, the inverted signal bus includes an additional voltage signal with multiple voltage levels that alternate at the particular frequency, such that the bus and inverted bus include different voltage levels (e.g., V+ and V−) during a particular time period. In some cases, the voltage signals $V_1$ and $V_2$ described in regard to FIG. 2 are examples of the bus and the inverted bus generated by the bus-generating component 950. For convenience, and not by way of limitation, FIG. 9 may identify the bus and inverted bus generated by the component 950 as BUS and !BUS, respectively.

In some cases, the bus-generating component 950 is an octal switch component that includes eight switches. In some implementations, the bus-generating component 950 is configured to generate multiple buses or inverted buses. For example, in addition to the bus and inverted bus described above in regard to FIG. 9, the bus-generating component 950 could be configured to generate, via additional switches of the octal switch component, an additional bus and an additional inverted bus. The example additional bus and additional inverted bus may, but need not, have characteristics that are similar to, different from, or partly similar to characteristics of the example bus and inverted bus, such as additional voltage level characteristics, additional frequency characteristics, or have other suitable characteristics that vary from characteristics of the bus and inverted bus. In some cases, the bus-generating component 950 is configured to provide multiple bus/inverted bus signal pairs to multiple types of IAI devices via multiple analog switch components, such as generally described in regard to FIG. 6.

In FIG. 9, the analog switch component 920 is an octal switch component including eight switches, including switches 931, 932, 933, 934, 935, 936, 937, and 938. In the analog switch component 920, the switch 931 has an input connection point 911a and an output connection point 911b. In addition, the switch 932 has respective input and output connection points 912a and 912b, the switch 933 has respective input and output connection points 913a and 913b, the switch 934 has respective input and output connection points 914a and 914b, the switch 935 has respective input and output connection points 915a and 915b, the switch 936 has respective input and output connection points 916a and 916b, the switch 937 has respective input and output connection points 917a and 917b, and the switch 938 has respective input and output connection points 918a and 918b.

Each of the switches 931-938 is configured to receive, via respective ones of the input connection points 911a-918a, one or more voltage signals. For instance, the input connection points 911a, 913a, 915a, and 917a are configured to receive the signal bus (e.g., BUS). In addition, the input connection points 912a, 914a, 916a, and 918a are configured to receive the inverted bus (e.g., !BUS).

In FIG. 9, the IAI devices 940, 942, 944, and 946 are configured to receive, at respective voltage input points, respective control voltage signals that are based on at least one of the bus or the inverted bus. In addition, the IAI devices 940, 942, 944, and 946 are configured as one or more pairs of neighbor IAI devices, such that the respective control voltage signals are received via respective shared electrical connections. For example, each of the IAI devices 940, 942, 944, and 946 includes at least one voltage input point that is electrically connected with an additional voltage input point of an additional one of the IAI devices 940, 942, 944, and 946.

The IAI device 940 has, for example, a voltage input point 971 and a voltage input point 972. The voltage input point 971 is electrically connected to the bus-generating component 950. The IAI device 940 is configured to receive, at the voltage input point 971, the signal bus from the bus-generating component 950. In addition, the voltage input point 972 is electrically connected to the output connection points 911*b* and 912*b*. The IAI device 940 is configured to receive, at the voltage input point 972, one or more of the bus or inverted bus via, respectively, the switches 931 and 932. For convenience, and not by way of limitation, the IAI device 940 can be referred to as an initial IAI device, such as an IAI device that receives a particular voltage signal at a particular voltage input point. In FIG. 9, the particular voltage input point 971 can be referred to as an initial voltage input point, such as a voltage input point that does not share an electrical connection with additional voltage input points of additional IAI devices. In FIG. 9, the IAI device 940 is described as receiving the signal bus at the voltage input point 971, but other implementations are possible, such as a multi-device control system in which an initial IAI device is configured to receive an inverted signal bus at an initial voltage input point.

In FIG. 9, the IAI device 940 and the IAI device 942 are arranged as neighbor IAI devices. For example, the IAI device 942 has a voltage input point 973 and a voltage input point 974. The voltage input point 973 is electrically connected to the output connection points 911*b* and 912*b* and also to the voltage input point 972 of the IAI device 940. In addition, the voltage input point 974 is electrically connected to the output connection points 913*b* and 914*b*. In FIG. 9, the neighbor IAI devices 940 and 942 share an electrical connection to the switches 931 and 932.

In addition, the IAI device 942 and the IAI device 944 are arranged as neighbor IAI devices. For example, the IAI device 944 has a voltage input point 975 and a voltage input point 976. The voltage input point 975 is electrically connected to the output connection points 913*b* and 914*b* and also to the voltage input point 974 of the IAI device 942. In addition, the voltage input point 976 is electrically connected to the output connection points 915*b* and 916*b*. In FIG. 9, the neighbor IAI devices 942 and 944 share an electrical connection to the switches 933 and 934.

Furthermore, the IAI device 944 and the IAI device 946 are arranged as neighbor IAI devices. For example, the IAI device 946 has a voltage input point 977 and a voltage input point 978. The voltage input point 977 is electrically connected to the output connection points 915*b* and 916*b* and also to the voltage input point 976 of the IAI device 944. In addition, the voltage input point 978 is electrically connected to the output connection points 917*b* and 918*b*. In FIG. 9, the neighbor IAI devices 944 and 946 share an electrical connection to the switches 935 and 936. In some cases, the IAI device 946 is arranged as a neighbor to an additional IAI device, such as an additional IAI device that is electrically connected to the output connection points 917*b* and 918*b* and also to the voltage input point 978 of the IAI device 946.

In the multi-device control system 900, one or more of the bus-generating component 950 or the analog switch component 920 receives a digital control signal, such as a signal using an SPI communication protocol. The digital control signal (or signals) can be received from at least one controller, such as the controller 105. For example, the bus-generating component 950 generates the bus and inverted bus responsive to a first digital control signal received from the controller, such as by modifying states of one or more of the switches 952, 954, 956, or 958. In addition, the analog switch component 920 modifies states of one or more of the switches 931-938 responsive to one or more of the first digital control signal or a second digital control signal from the controller (or an additional controller).

In some cases, the analog switch component 920 is configured to provide control voltage signals to the IAI devices 940, 942, 944, and 946 via one or more of the switches 931-938. For example, responsive to the digital control signal indicating a particular state of the IAI device 940, the analog switch component 920 modifies the switches 931 and 932. Based on the modified states of the switches 931 and 932, the analog switch component 920 provides to the voltage input point 972 a first control voltage signal that is based on the bus or the inverted bus. The voltage input point 972 receives the first control voltage signal that is similar to (e.g., the bus) or different from (e.g., the inverted bus) the bus received at the voltage input point 971. For example, the IAI device 940 enters a first state (e.g., activates) responsive to receiving control voltage signals that generate a voltage differential across the voltage input points 971 and 972, or a second state (e.g., deactivates) responsive to receiving similar control voltage signals (e.g., a voltage differential that is not sufficient for activation) via the voltage input points 971 and 972.

In FIG. 9, the IAI device 942 receives, via the voltage input point 973, the first control voltage signal that is received by the IAI device 940 via the voltage input point 972. In addition, responsive to the digital control signal, the analog switch component 920 provides a second control voltage signal to the voltage input point 974 of the IAI device 942, such as by modifying states of the switches 933 and 934. In some cases, the second control voltage signal at the voltage input point 974 is similar to or different from the first control voltage signal at the voltage input point 973. For example, the IAI device 942 enters a first state responsive to receiving control voltage signals that generate a voltage differential across the voltage input points 973 and 974, or a second state responsive to receiving similar control voltage signals via the voltage input points 973 and 974.

In addition, the IAI device 944 receives, via the voltage input point 975, the second control voltage signal that is received by the IAI device 942 via the voltage input point 974. Responsive to the digital control signal, the analog switch component 920 provides a third control voltage signal to the voltage input point 976 of the IAI device 944, such as by modifying states of the switches 935 and 936. In some cases, the third control voltage signal at the voltage input point 976 is similar to or different from the second control voltage signal at the voltage input point 975. For example, the IAI device 944 enters a first state responsive to receiving control voltage signals that generate a voltage differential across the voltage input points 975 and 976, or a second state responsive to receiving similar control voltage signals via the voltage input points 975 and 976.

In addition, the IAI device 946 receives, via the voltage input point 977, the third control voltage signal that is received by the IAI device 944 via the voltage input point 976. Responsive to the digital control signal, the analog switch component 920 provides a fourth control voltage signal to the voltage input point 978 of the IAI device 946, such as by modifying states of the switches 937 and 938. In some cases, the fourth control voltage signal at the voltage input point 978 is similar to or different from the third control voltage signal at the voltage input point 977. For example, the IAI device 946 enters a first state responsive to receiving control voltage signals that generate a voltage differential across the voltage input points 977 and 978, or a second state responsive to receiving similar control voltage signals via the voltage input points 977 and 978. In some cases, an additional IAI device arranged as a neighbor to the IAI device 946 could receive the fourth control voltage signal at an additional voltage input point that is electrically connected to the voltage input point 978.

In some cases, the analog switch component 920 modifies each of the switches 931-938 independently of additional ones of the switches 931-938. In addition, one or more control voltage signals for each of the IAI devices 940, 942, 944, and 946 is determined, in part, based on one or more control voltage signals received by neighboring IAI devices. For example, if the IAI device 940 is indicated, based on data in the digital control signal, as being in an activated state, the analog switch component 920 may provide to the voltage input point 972 the inverted bus, which generates a voltage differential with respect to the bus received at voltage input point 971. In addition, if the IAI device 942 is indicated as being in an activated state, the analog switch component 920 may provide to the voltage input point 974 the bus, which generates a voltage differential with respect to the inverted bus received at voltage input point 973 (e.g., at the shared connection with voltage input point 972). Additional control signals to the IAI devices 944, 946, or additional IAI devices can be provided based on respective states indicated by the digital control signal.

Continuing with this example, if the analog switch component 920 receives a modified digital control signal indicating modified states of the IAI devices 940, 942, 944, or 946, the analog switch component 920 modifies at least one control voltage signal. For instance, if the modified digital control signal indicates a deactivated state for the IAI device 940 and the activated state for the IAI device 942, the analog switch component 920 may provide to the voltage input point 972 the bus, which is similar to (e.g., a voltage differential that is not sufficient for activation) the bus received at voltage input point 971. The analog switch component 920 may also provide to the voltage input point 974 the inverted bus, which is different from the bus received at voltage input point 973 (e.g., responsive to the modified digital control signal). Additional control signals to the IAI devices 944, 946, or additional IAI devices can be modified based on respective states indicated by the modified digital control signal.

In the multi-device control system 900, the analog switch component 920 provides individual control to the multiple IAI devices 940, 942, 944, and 946, based on control voltage signals that are received via shared electrical connections. In some cases, control voltage signals that incur a particular state in a particular one of the IAI devices 940, 942, 944, and 946 can be determined based on additional control voltage signals received by a neighboring one of the IAI devices 940, 942, 944, and 946. FIG. 9 describes the analog switch component 920 as providing voltage control signals via the switches 931-938, but other implementations are possible, such as a multi-device control system that provides one or more voltage control signals via a single-pull multi-throw relay, a multiplexer, or another suitable component.

Figure 10:
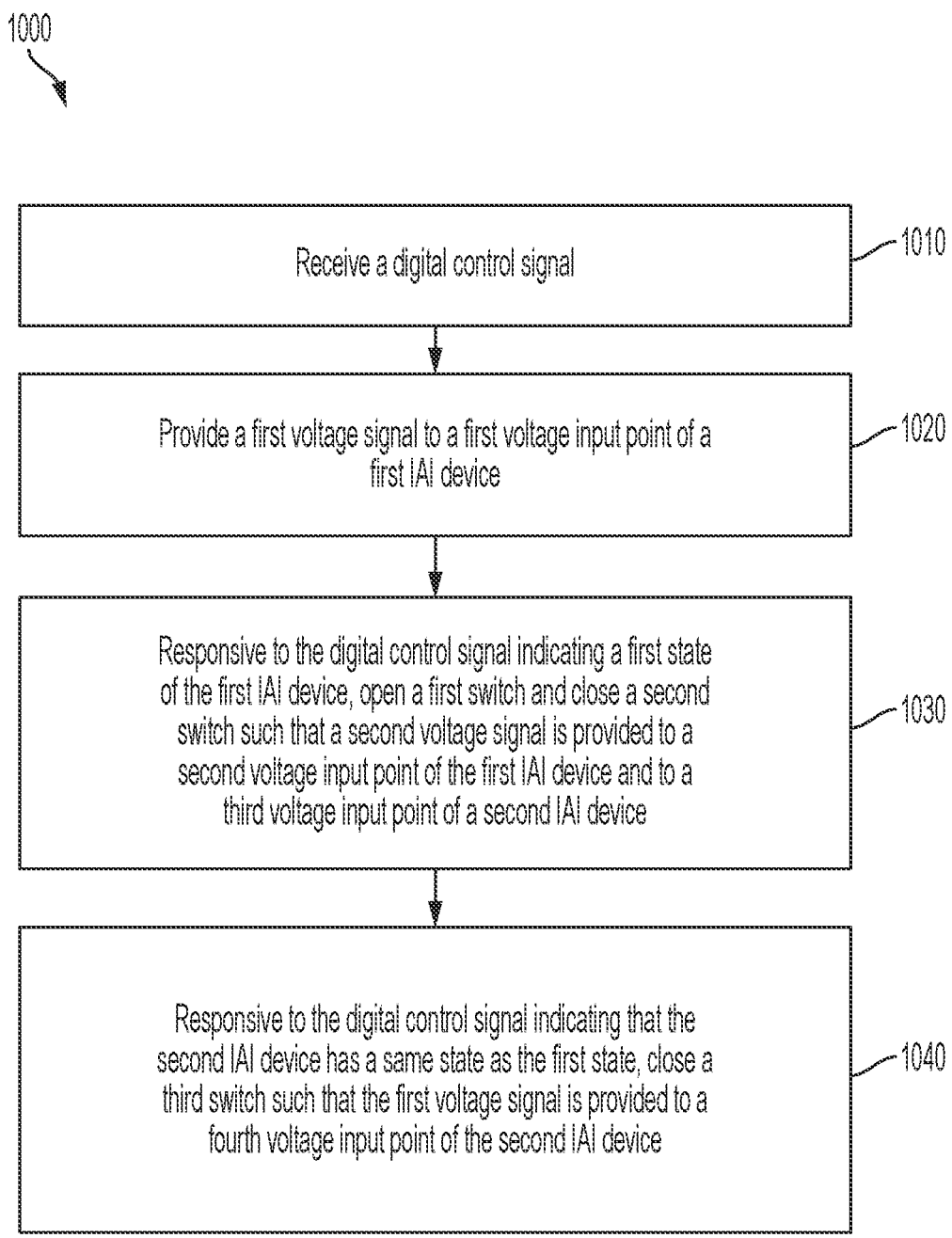
FIG. 10 is a flow chart depicting an example of a process for providing voltage signals to multiple IAI devices, such as in a multi-device control system with a neighbor control configuration, according to certain embodiments.

FIG. 10 is a flow chart depicting an example of a process 1000 for providing voltage signals to multiple IAI devices in a configuration having neighbor control, such as a relatively dense array of IAI devices. In some cases, the process 1000 is implemented in a multi-device control system with a 2:1 configuration, a 4:1 configuration, or other suitable configurations. In some embodiments, such as described in regard to FIGS. 1-9, a processing device implementing a multi-device control system implements operations described in FIG. 10, by executing suitable program code. For illustrative purposes, the process 1000 is described with reference to the examples depicted in FIGS. 1-9. Other implementations, however, are possible.

At block 1010, the process 1000 involves receiving a digital control signal. For example, an analog switch component in a multi-device control system, such as the analog switch component 920, receives a digital control signal from a controller. In some cases, the digital control signal includes data indicating one or more states associated with at least one IAI device that is electrically connected with the analog switch component. For example, the digital control signal received by the analog switch component 920 includes data describing one or more states associated with the IAI devices 940, 942, 944, or 946.

At block 1020, the process 1000 involves providing a first control voltage signal to a first voltage input point, such as a first voltage input point of a first IAI device. The first control voltage signal is based on, for example, a signal bus, an inverted signal bus, or a voltage signal (e.g., $V_A$, $V_B$). In some cases, the first control voltage signal is provided to the first IAI device via an electrical connection to a first signal output point of a bus-generating component. For example, the voltage input point 971 is electrically connected to a first signal output point of the bus-generating component 950. In some cases, the first voltage input point of the first IAI device is electrically connected to an input connection point of an analog switch component, such as an electrical connection of the voltage input point 971 with the input connection point 911a. FIG. 9 depicts the voltage input point 971 as having an electrical connection to the input connection point 911a, but other implementations are possible. For example, a multi-device control system with a 4:1 configuration with neighbor control could include an initial IAI device having an electrical connection to a particular signal output point of a bus-generating component without an electrical connection to an input connection point of an analog switch component.

At block 1030, the process 1000 involves modifying one or more switches responsive to the digital control signal, such as a state of (at least) a first switch and a second switch. The first and second switches are associated, for instance, with a shared electrical connection of the first IAI device and a second IAI device, such as the switches 931 and 932 being associated with a shared electrical connection of the voltage input points 972 and 973. In some cases, responsive to the digital control signal indicating a first state of the particular IAI device, the analog switch component opens the first switch and closes the second switch to provide a second voltage signal to a second voltage input point of the first IAI device. In addition, the second voltage signal is provided to a third voltage input point of the second IAI device, such as via the shared electrical connection. For example, responsive to the digital control signal indicating a first state (e.g., activated) for the IAI device 940, the analog switch component 920 opens the switch 931 and closes the switch 932.

In the first state, for example, the IAI device 940 receives the first voltage signal BUS via the voltage input point 971 and the second voltage signal !BUS via the switch 932. In addition, the IAI device 942 receives the second voltage signal !BUS via the shared electrical connection of voltage input points 972 and 973.

At block 1040, the process 1000 involves modifying the state of one or more additional switches, responsive to the digital control signal. For example, responsive to the digital control signal indicating that the second IAI device has a same state as the first state (e.g., the first and second IAI devices are both activated), the analog switch component modifies (at least) a third switch to provide the first voltage signal to a fourth voltage input point of the second IAI device. For example, responsive to the digital control signal indicating that the IAI device 940 is activated, e.g., similar to the first state described above, the analog switch component 920 closes the switch 933, such that the first voltage signal BUS is provided to the voltage input point 974. In some cases, one or more additional switches are modified responsive to the digital control signal indicating the state of the second IAI device, such as opening the switch 934 or modifying additional switches associated with additional IAI devices in the multi-device control system 900.

In some cases, the analog switch component controls the one or more switches such that the particular IAI device does not receive the first voltage signal and second voltage signal at a particular voltage input point during a particular time period. For example, the analog switch component 920 controls the switches 931-938 such that switches 931 and 932 (or other pairs connected to a particular voltage input point) are not closed during a same time period.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A control system for multiple independent alternating-input ("IAI") devices, the control system comprising:
   an IAI device included in the multiple IAI devices, the IAI device having:
      a first voltage input point, and
      a second voltage input point; and
   an analog switch component having:
      a first input connection point,
      a first switch configured to selectively connect and disconnect the first input connection point and the first voltage input point,
      a second input connection point, and
      a second switch configured to selectively connect and disconnect the second input connection point and the second voltage input point;
   the analog switch component being configured to, in a first state of the IAI device:
      i) provide a first voltage signal to the first voltage input point via the first switch, and
      ii) provide a second voltage signal to the second voltage input point via the second switch; and
   the analog switch component being further configured to, in a second state of the IAI device:
      provide the first voltage signal to (i) the first voltage input point via the first switch and (ii) the second voltage input point via a third switch of the analog switch component.

2. The control system of claim 1, further comprising an additional IAI device included in the multiple IAI devices, wherein the additional IAI device receives the first voltage signal at an additional voltage input point via an additional switch of the analog switch component.

3. The control system of claim 2, wherein the analog switch component is configured to control the first switch, the second switch, and the third switch responsive to a first digital control signal, and control the additional switch responsive to a second digital control signal.

4. The control system of claim 1, the analog switch component being further configured to, responsive to a digital control signal, modify the first voltage signal or the second voltage signal via pulse width modulation.

5. The control system of claim 1, the analog switch component being further configured to, in the first state:
  determine a time period during which the first voltage signal is provided via the first switch and the second voltage signal is provided via the second switch; and
  during an additional time period, provide the first voltage signal to the second voltage input point via the third switch and provide the second voltage signal to the first voltage input point via a fourth switch,
  wherein in the first state, the first voltage signal and the second voltage signal are provided to the first voltage input point in alternating time periods via the first switch and the third switch, and the first voltage signal and the second voltage signal are provided to the second voltage input point in the alternating time periods via the second switch and the fourth switch.

6. The control system of claim 1, the analog switch component being further configured to, in the second state:
  subsequent to providing the first voltage signal to the first voltage input point and to the second voltage input point, open the first switch and the second switch.

7. The control system of claim 1, wherein the IAI device is one of a polymer dispersed liquid crystal visual element, a polychromic material visual element, a solenoid, a speaker, or a motor.

8. A control system for one or more independent alternating-input ("IAI") devices, the control system comprising:
  an IAI device included in the one or more IAI devices, the IAI device having:
    a first voltage input point, and
    a second voltage input point;
  a bus-generating component having:
    a first signal output point configured to provide a first voltage signal, wherein the first signal output point and the first voltage input point have an electrical connection, and
    a second signal output point configured to provide a second voltage signal; and
  an analog switch component having:
    a first input connection point,
    a second input connection point, wherein the second signal output point and the second input connection point are electrically connected, and
    a switch configured to selectively connect and disconnect the second input connection point and the second voltage input point,
  the bus-generating component being configured to provide the first voltage signal to the first voltage input point via the electrical connection; and
  the analog switch component being configured to:
    i) responsive to a digital control signal indicating a first state, close the switch such that the second voltage signal is provided to the second voltage input point via the switch, and
    ii) responsive to the digital control signal indicating a second state, open the switch such that the second voltage input point is electrically disconnected from the switch.

9. The control system of claim 8, the analog switch component being further configured to:
  responsive to the digital control signal indicating the second state, close an additional switch such that the first voltage signal is provided to the second voltage input point via the additional switch.

10. The control system of claim 8, further comprising an additional IAI device included in the one or more IAI devices, the additional IAI device having a first additional voltage input point and a second additional voltage input point, wherein the first input connection point and the first additional voltage input point are electrically connected,
  the analog switch component being further configured to close an additional switch such that the second voltage signal is provided to the second additional voltage input point via the additional switch.

11. The control system of claim 8, the analog switch component being further configured to, responsive to the digital control signal, modify the first voltage signal or the second voltage signal via pulse width modulation.

12. The control system of claim 8, wherein an additional IAI device included in the one or more IAI devices receives the first voltage signal at an additional voltage input point via an additional switch of the analog switch component.

13. The control system of claim 12, wherein the analog switch component is configured to control the switch responsive to a first digital control signal, and control the additional switch responsive to a second digital control signal.

14. The control system of claim 8, wherein the IAI device is one of a polymer dispersed liquid crystal visual element, a polychromic material visual element, a solenoid, a speaker, or a motor.

15. A control system for independent alternating-input ("IAI") devices, the control system comprising:
  a first IAI device having a first voltage input point and a second voltage input point;
  a second IAI device having a third voltage input point and a fourth voltage input point,
    wherein the second voltage input point and the third voltage input point are electrically connected; and
  an analog switch component having:
    a first input connection point;
    a second input connection point;
    a first switch configured to selectively connect and disconnect the first input connection point to the second voltage input point and the third voltage input point;
    a second switch configured to selectively connect and disconnect the second input connection point to the second voltage input point and the third voltage input point; and
    a third switch configured to selectively connect and disconnect the first input connection point to the fourth voltage input point,
  the first IAI device being configured to receive a first voltage signal via the first voltage input point; and
  the analog switch component being configured to:
    i) responsive to a digital control signal indicating that the first TAT device has a first state, open the first switch and close the second switch, such that a second voltage signal is provided to the second voltage input point and the third voltage input point via the second switch, and
    ii) responsive to the digital control signal indicating that the second TAT device has a same state as the first state of the first TAT device, close the third switch, such that the first voltage signal is provided to the fourth voltage input point via the third switch.

16. The control system of claim 15, the analog switch component having a fourth switch configured to selectively connect and disconnect the second input connection point to the fourth voltage input point.

17. The control system of claim 16, the analog switch component being further configured to:

responsive to the digital control signal indicating that the second TAT device has a second state, open the third switch and close the fourth switch, such that the second voltage signal is provided to the fourth voltage input point.

18. The control system of claim 16, the analog switch component being further configured to:

responsive to the digital control signal indicating that the first TAT device has a second state and the second TAT device has the same state as the first state,
  i) close the first switch and open the second switch, such that the first voltage signal is provided to the second voltage input point and the third voltage input point via the first switch, and
  ii) open the third switch and close the fourth switch, such that the second voltage signal is provided to the fourth voltage input point via the fourth switch.

19. The control system of claim 15, the analog switch component being further configured to, responsive to the digital control signal, modify the first voltage signal or the second voltage signal via pulse width modulation.

20. The control system of claim 15, wherein each of the first IAI device and the second IAI device is one of a polymer dispersed liquid crystal visual element, a polychromic material visual element, a solenoid, a speaker, or a motor.

* * * * *